United States Patent
Sekine

(10) Patent No.: US 9,698,184 B2
(45) Date of Patent: Jul. 4, 2017

(54) IMAGE SENSOR AND DRIVING METHOD THEREOF

(71) Applicant: NLT Technologies, Ltd., Kanagawa (JP)

(72) Inventor: Hiroyuki Sekine, Kanagawa (JP)

(73) Assignee: NLT TECHNOLOGIES, LTD., Kanagawa (JP)

(*) Notice: Subject to any disclaimer, the term of this patent is extended or adjusted under 35 U.S.C. 154(b) by 0 days.

(21) Appl. No.: 14/806,833

(22) Filed: Jul. 23, 2015

(65) Prior Publication Data

US 2016/0027827 A1    Jan. 28, 2016

(30) Foreign Application Priority Data

Jul. 23, 2014    (JP) .................................. 2014-149909

(51) Int. Cl.
| | |
|---|---|
| *G01T 1/24* | (2006.01) |
| *H01L 27/146* | (2006.01) |
| *H01L 29/786* | (2006.01) |

(52) U.S. Cl.
CPC .. *H01L 27/14612* (2013.01); *H01L 27/14614* (2013.01); *H01L 27/14632* (2013.01);
(Continued)

(58) Field of Classification Search
CPC ......... H01L 27/14612; H01L 27/14614; H01L 27/14632; H01L 27/14643;
(Continued)

(56) References Cited

U.S. PATENT DOCUMENTS

| | | | | |
|---|---|---|---|---|
| 5,399,889 A | * | 3/1995 | Miyake | ................... H01L 27/12 250/370.08 |
| 7,354,807 B2 | * | 4/2008 | Yu | ....................... G02F 1/13624 438/149 |

(Continued)

FOREIGN PATENT DOCUMENTS

| | | |
|---|---|---|
| JP | 58-068968 | 4/1983 |
| JP | 60-091666 | 5/1985 |

(Continued)

OTHER PUBLICATIONS

Non-final Office Action dated May 10, 2017 in U.S. Appl. No. 15/489,794.

*Primary Examiner* — David J Makiya
*Assistant Examiner* — Taeho Jo
(74) *Attorney, Agent, or Firm* — Young & Thompson

(57) ABSTRACT

With an image sensor in which the amplifier circuit is disposed at each pixel, there is such an issue that the threshold voltage of the transistor fluctuates so that the signal voltage fluctuates because a voltage is continuously applied between the source and the gate of the transistor at all times when using the amorphous thin film semiconductor as the transistor that constitutes an amplifier circuit. The gate-source potential of the TFT that constitutes the amplifier circuit is controlled so that the gate terminal voltage becomes smaller than the source terminal voltage in an integrating period where the pixels accumulate the signals, and controlled so that the gate terminal voltage becomes larger than the source terminal voltage in a readout period where the pixels output the signals.

3 Claims, 18 Drawing Sheets

(52) U.S. Cl.
CPC .. *H01L 27/14659* (2013.01); *H01L 27/14663* (2013.01); *H01L 29/78663* (2013.01); *H01L 29/78693* (2013.01); *H01L 27/14643* (2013.01)

(58) Field of Classification Search
CPC ......... H01L 27/14659; H01L 27/14663; H01L 29/78663; H01L 29/78693
USPC ....................................................... 250/370
See application file for complete search history.

(56) References Cited

U.S. PATENT DOCUMENTS

| | | | |
|---|---|---|---|
| 7,875,841 B2 * | 1/2011 | Furst | B82Y 10/00 250/208.1 |
| 8,441,459 B2 | 5/2013 | Chen et al. | |
| 2003/0127599 A1 | 7/2003 | Numai et al. | |
| 2006/0022202 A1 * | 2/2006 | Yu | G02F 1/13624 257/72 |
| 2006/0043375 A1 | 3/2006 | Takasugi et al. | |
| 2006/0113484 A1 | 6/2006 | Endo | |
| 2007/0029552 A1 * | 2/2007 | Yu | G02F 1/13624 257/59 |
| 2009/0315877 A1 * | 12/2009 | Deane | G09G 3/3233 345/214 |
| 2010/0091162 A1 * | 4/2010 | Chuang | H04N 5/374 348/308 |
| 2010/0102313 A1 * | 4/2010 | Miyairi | H01L 27/1225 257/43 |
| 2010/0134735 A1 * | 6/2010 | Nakamura | H01L 31/1055 349/116 |
| 2010/0231562 A1 * | 9/2010 | Brown | G06F 3/0412 345/207 |
| 2011/0062432 A1 * | 3/2011 | Yamazaki | H01L 29/7869 257/43 |
| 2011/0109601 A1 * | 5/2011 | Brown | G06F 3/0412 345/204 |
| 2011/0122111 A1 * | 5/2011 | Brown | G06F 3/0412 345/207 |
| 2011/0175886 A1 | 7/2011 | Yamaguchi et al. | |
| 2011/0221723 A1 * | 9/2011 | Kurokawa | G06F 3/042 345/207 |
| 2012/0087460 A1 * | 4/2012 | Moriwaki | H01L 27/0255 377/64 |
| 2012/0187455 A1 * | 7/2012 | Brown | G01J 1/04 257/229 |
| 2013/0093025 A1 | 4/2013 | Miyake et al. | |

FOREIGN PATENT DOCUMENTS

| | | |
|---|---|---|
| JP | 04-206573 | 7/1992 |
| JP | 11-211832 | 8/1999 |
| JP | 2009-540628 | 11/2009 |
| JP | 2010-098714 | 4/2010 |

* cited by examiner

IMAGE SENSOR AND DRIVING METHOD THEREOF

CROSS-REFERENCE TO RELATED APPLICATION

This application is based upon and claims the benefit of priority from Japanese patent application No. 2014-149909, filed on Jul. 23, 2014, the disclosure of which is incorporated herein in its entirety by reference.

BACKGROUND OF THE INVENTION

1. Field of the Invention

The present invention relates to an image sensor and, more specifically, to an image sensor in which an amplifier circuit is provided to each pixel.

2. Description of the Related Art

The techniques for inspecting the inside of an examination target by nondestructive testing using X-ray transmission images are essential techniques in the fields of medical and industrial nondestructive testing. In particular, an X-ray image sensor which directly captures X-ray transmission images as electronic data has become broadly employed since it is rapid in capturing images, capable of assisting image reading by performing image processing, capable of handling moving images, etc. Mainly used as the X-ray image sensor is a device called FPD (Flat Panel Detector). In the FPD, each of two-dimensionally disposed pixels is provided with: a photoelectric conversion section which converts the X-ray into an electric charge; and a switching element which takes out signal electric charges accumulated in the photoelectric conversion section to the outside. The FPD is fabricated by using a thin film semiconductor technique on a large-area substrate such as glass. It is because an X-ray reduction optical system cannot be fabricated easily unlike the case of visible light, so that the size of the FPD is required to be in a same size as that of the examination target or larger. Thus, as the switching element disposed at the pixel, a TFT (Thin Film Transistor) is used.

The FPD can be roughly classified into two kinds depending on the systems for converting the X-ray into electric charges. One is an indirect conversion system which converts the X-ray into visible light, and the visible light is converted into electric charges. The other one is a direct conversion type which converts the X-ray into electric charges directly.

As the indirect conversion type FPD, there is a structure disclosed in FIG. 5 of Japanese Unexamined Patent Publication Hei 04-206573 (Patent Document 1). In this structure, a phosphor is stacked via an insulating film on a part where a photodiode and a transistor are formed. The phosphor layer emits visible light by irradiation of X-ray, and the photodiode converts the visible light into an electric charge. Further, the technique of Patent Document 1 discloses a case of forming the photodiode and the transistor with a-Si (amorphous silicon).

As the direct conversion type FPD, there is a structure disclosed in FIG. 1 of Japanese Unexamined Patent Publication Hei 11-211832 (Patent Document 2). In this structure, a pixel formed by connecting a photoconductive layer to a transistor is formed on a substrate. X-ray is absorbed by the photoconductive layer and directly converted into an electric charge. The technique of Patent Document 2 discloses a method which uses ZnO, CdS, CdSe, or the like as the photoconductive layer.

Signals in the FPD of the both types are outputted as the electric charges, which are converted into voltages by a signal detection circuit such as an external integrator and digitalized. The techniques of Patent Documents 1 and 2 shown herein output the signal electric charges themselves acquired by each pixel, so that those may be classified as PPS (Passive Pixel Sensor) in some cases because the signal electric charges are not amplified within the pixels with those techniques.

Recently, in the field of medical treatment, it has become strongly desired to decrease exposure to radiation and achieve high definition for the X-ray diagnosis devices. When the X-ray irradiation amount is decreased for decreasing the exposure to radiation, the signal electric charges detected by the FPD is decreased so that the S/N ratio is deteriorated. Further, when the pixel size of the FPD is designed to be small for achieving high definition, the signal electric charge is also decreased accordingly. Therefore, the S/N ratio is deteriorated. That is, in order to achieve both low exposure to radiation and high definition, it is essential to increase the S/N ratio of the FPD.

As the way of increasing the S/N ratio of the image sensor, there is a technique called APS (Active Pixel Sensor) which is employed for CMOS image sensors. It is a technique with which an amplifier circuit is provided to each pixel of an image sensor in addition to a photoelectric conversion element such as a photodiode to amplify and output the signals of the photoelectric conversion element. This technique makes it possible to improve the S/N ratio of the signals greatly compared to the case of the PPS type.

The CMOS image sensor is normally integrated on a monocrystalline Si substrate and mainly used for an optical camera or the like, and the APS technique has been tried to be employed for thin film transistors. As examples thereof, there are the techniques disclosed in Japanese Unexamined Patent Publication Sho 58-068968 (Patent Document 3 (FIG. 1)) and Japanese Unexamined Patent Publication Sho 60-091666 (Patent Document 4 (FIG. 2)). The technique disclosed in Patent Document 3 is a case where a polycrystalline Si TFT is used as a transistor for amplifying the signal. The technique disclosed in Patent Document 4 is a case where an a-Si TFT is used as a transistor for amplifying the signal.

Actually, however, the APS image sensors using the polycrystalline Si TFT or the a-Si TFT are hardly put into practical use. Reasons thereof will be described hereinafter.

In the case of using the polycrystalline Si TFT, variation in the threshold voltage is extremely large. The variation in the characteristic is a substantial problem caused by variation in the crystalline particle diameter of the polycrystalline Si. When there is variation generated in the threshold voltage of the TFTs constituting the amplifier circuits, there is also variation generated in the output voltage of the amplifier circuits. The variation in the threshold voltage is significant between the TFT elements disposed extremely close to each other, so that it is difficult to eliminate it by devising the circuits. Thus, when the amplifier circuit of the polycrystalline Si TFT is provided to each pixel of the image sensor, there is variation generated in the signals in each of the pixels, thereby generating FPN (Fixed Pattern Noise).

In a case where the a-Si TFT is used for amplifying the signals, the issue of variation in the threshold voltage caused due to the crystalline structure like the case of the polycrystalline Si TFT does not occur due to its amorphous structure. However, there is an issue generated in terms of the reliability, and it is a phenomenon where the threshold voltage fluctuates greatly when a voltage is continuously applied between the gate and the source with the a-Si TFT. With the TFT used for the amplifier circuit, a voltage for making the TFT electrically connected at all times is continuously applied between the gate and the source. Thus, the threshold voltage of the TFT used for the amplifier circuit fluctuates, so that the output voltage also fluctuates accordingly. The issue regarding the reliability is also generated with the TFT using an amorphous oxide semiconductor.

The fluctuation amount of the threshold voltage of the a-Si TFT, the amorphous oxide semiconductor TFT, and the like depends on the extent and the time of the voltage applied between the gate and source of the TFT. Thus, it is considered to suppress the fluctuation in the threshold voltage through controlling the voltage applied between the source and the gate to be small and to shorten the applying time.

Even though it is not targeted to overcome the above-described issue regarding the reliability of the TFT, Japanese Unexamined Patent Publication 2010-098714 (Patent Document 5 (FIG. 1, FIG. 2)) discloses a technique for altering the gate voltage of the TFT to be the amplifier circuit in the image sensor that employs the APS technique.

FIG. 16 shows the circuit structure of the image sensor disclosed in Patent Document 5 as Related Art 1. With Related Art 1, each pixel 900 of the image sensor is provided with: a transistor 901 to be the amplifier circuit; a photodiode 902, a storage capacitance 903, and a reset transistor 904.

A first terminal 951 of a current source 905 that is the load for the transistor 901 is connected to an output wiring DATA that is common to each pixel sequence. Regarding the photodiode 902, an anode terminal 92a is connected to a control line RSEL, and a cathode terminal 92k is connected to a gate terminal 91g of the transistor 901 and a source terminal 94s of the transistor 904. The storage capacitance 903 is connected in parallel to the photodiode 902. Regarding the transistor 901, a drain terminal 91d is connected to a power source line P91 (power source voltage VDD), and a source terminal 91s is connected to the output wiring DATA. Regarding the transistor 904, a gate terminal 94g is connected to a control line RST, and a drain terminal 94d is connected to a power source line P92 (power source voltage VREF). A second terminal 952 of the current source 905 is connected to a power source line P93 (source voltage VREF).

FIG. 17 is a timing chart showing operations of Related Art 1, which shows voltages of the control lines RST, RSEL and the nodes N1, N2 shown in FIG. 16. Solid lines and broken lines of the nodes N1 and N2 show the voltages where the light amount of LuxA and LuxB are irradiated, respectively.

The operation is mainly divided into three periods. In a reset period from time t0 to t1, the transistor 904 comes to be in an electrically connected state because the potential of the control line RST changes from VSS to VDD, the both-end voltages of the photodiode 902 and the storage capacitance 903 are reset, and the potential of the node N1 turns to VREF.

In an integrating period from time t1 to t2, the electric charges of the photodiode 902 and the storage capacitance 903 are decreased according to the light amount irradiated to the photodiode 902, and the voltage of the node N1 is decreased.

In a readout period from time t2 to t3, the potential of the control line RSEL is increased from VSS to VREF. Thus, the potential of the node N1 is also increased to be equal to or higher than the threshold voltage of the transistor 901, and the potential of the node N2 is increased.

From the perspective of the gate-source voltage of the transistor 901 as the amplifier circuit, the following can be said. That is, in the reset period from time t0 to t1, the voltage of VREF is applied to the gate terminal 91g. However, the voltage of the source terminal 91s is also VREF, so that no voltage is applied between the gate and the source.

In the integrating period from time t1 to t2, a photoelectric current is flown to the photodiode 902 according to the irradiated light amount. As the electric charges accumulated in the photodiode 902 and the storage capacitance 903 decrease, the gate voltage of the transistor 901 changes to the decreasing direction. Thus, the polarity of the voltage between the gate and the source of the transistor 901 turns to negative.

In the readout period from time t2 to t3, the gate voltage of the transistor 901 is increased as the potential of the control line RSEL is increased, and the voltage between the gate and the source is increased in positive polarity. Thereafter, the parasitic capacitance of the output wiring DATA is charged by the transistor 901, and the potential of the node N2 reaches the voltage lower than the gate voltage of the transistor 901 by the amount of the threshold voltage. That is, a positive voltage is not applied continuously at all times between the gate and the source of the amplifier circuit TFT using the APS technique but a negative voltage may be applied or the extent of the voltage may be changed arbitrarily. The similar technique is also disclosed in Japanese Unexamined Patent Application Publication 2009-540628 (Patent Document 6 (FIG. 8, FIG. 9)).

However, with Related Art 1, the signals outputted from each of the pixels 900 come to be delayed when the gate potential of the transistor 901 constituting the amplifier circuit is controlled. This causes such a critical issue that high-speed operations cannot be executed. The reasons thereof will be described hereinafter.

In the circuit structure of FIG. 16, the source terminal 91s of the transistor 901 functioning as the amplifier circuit is directly connected to the output wiring DATA. In a case where the voltage of the node N1 that is the gate voltage of the transistor 901 is smaller than the value acquired by adding the threshold voltage to the source voltage of the transistor 901, the transistor 901 is in an off state but the capacitance between the gate and the source of the transistor 901 becomes the parasitic capacitance of the output wiring DATA.

In a case where a-Si or an amorphous oxide semiconductor is used as the semiconductor material of the transistor 901, TFT of an inverted staggered structure as shown in FIG. 18 is employed for the transistor 901. In the transistor 901, a gate electrode 911 is formed on a substrate, a semiconductor layer 930 is formed thereon via a gate insulating film 920, and a drain electrode 941 and a source electrode 942 are formed at both ends of the semiconductor layer 930, respectively.

The reason for employing the inverted staggered structure for the transistor 901 is because the TFT manufacturing steps can be simplified compared to the cases of employing other structures (e.g., a case of employing a planar structure). However, with the inverted staggered structure, the two-dimensionally overlapping area of the source electrode 942 and the gate electrode 911 becomes large, so that the capacitance between the gate and the source becomes larger as well. That is, the parasitic capacitance of the output wiring DATA becomes large.

Further, the transistor 901 operates as a source follower, and the voltage between the gate and the source becomes smaller as the output voltage of the source follower approaches the target voltage (an ideal output voltage corresponding to an input voltage). This means that the drain current of the transistor 901 decreases abruptly as the output voltage approaches the target voltage.

Normally, in order to improve the response speed of the source follower, used is a method which increases the channel width of the transistor 901. However, with the circuit structure disclosed herein, the parasitic capacitance of the output wiring DATA becomes increased when the channel width of the transistor 901 is increased. Thus, the response speed cannot be improved. This issue becomes more conspicuous as the number of pixels connected to a single output wiring DATA becomes greater. That is, it is a critical issue for the image sensor having a great number of pixels.

It is therefore an exemplary object of the present invention to provide an image sensor suited for a radiation image capturing device with which: the fluctuation in the characteristic of a signal amplifying transistor formed by a thin film semiconductor disposed at each pixel is suppressed; no issue in terms of the reliability is generated; the S/N ratio is high; and high-speed operations can be done.

SUMMARY OF THE INVENTION

The first image sensor according to an exemplary aspect of the invention is an image sensor which includes a photodiode, a first TFT, a second TFT, and a third TFT provided at each pixel, wherein: an anode terminal of the photodiode is connected to a gate terminal of the first TFT and a source terminal of the third TFT, and a cathode terminal of the photodiode is connected to a first control signal line; a drain terminal of the first TFT is connected to a first power source line, and a source terminal of the first TFT is connected to a drain terminal of the second TFT; a gate terminal of the second TFT is connected to the first control signal line, and a source terminal of the second TFT is connected to an output signal line; and a gate terminal of the third TFT is connected to a second control signal line, and a drain terminal of the third TFT is connected to a second power source line.

The second image sensor according to another exemplary aspect of the invention is an image sensor which includes a photodiode, a first TFT, and a second TFT provided at each pixel, wherein: one of terminals of the photodiode is connected to a gate terminal of the first TFT and a source terminal of the second TFT, and other terminal is connected to a first control signal line; a drain terminal of the first TFT is connected to a first power source line, and a source terminal of the first TFT is connected to an output signal line; a gate terminal of the second TFT is connected to a second control signal line, and a drain terminal of the second TFT is connected to a second power source line; the first TFT and the second TFT are formed with an inverted staggered structure, a top contact structure, or a bottom contact structure; and in the first TFT, a two-dimensionally overlapping area of a source electrode and a gate electrode is smaller than a two-dimensionally overlapping area of a drain electrode and the gate electrode.

The first image sensor driving method according to still another exemplary aspect of the invention is a method for driving an image sensor which includes a photodiode, a first TFT, a second TFT, and a third TFT provided at each pixel, wherein: an anode terminal of the photodiode is connected to a gate terminal of the first TFT and a source terminal of the third TFT, and a cathode terminal of the photodiode is connected to a first control signal line; a drain terminal of the first TFT is connected to a first power source line, and a source terminal of the first TFT is connected to a drain terminal of the second TFT; a gate terminal of the second TFT is connected to the first control signal line, and a source terminal of the second TFT is connected to an output signal line; and a gate terminal of the third TFT is connected to a second control signal line, and a drain terminal of the third TFT is connected to a second power source line, and the method includes: dividing a driving period of the image sensor to an integrating period where a light signal is irradiated to the pixels and to a readout period where a signal is read out from the pixels; making a gate voltage of the first TFT smaller than a source voltage of the first TFT in the integrating period; and making the gate voltage of the first TFT larger than the source voltage of the first TFT in the readout period.

The second image sensor driving method according to still another exemplary aspect of the invention is a method for driving an image sensor which includes a photodiode, a first TFT, and a second TFT provided at each pixel, wherein: one of terminals of the photodiode is connected to a gate terminal of the first TFT and a source terminal of the second TFT, and other terminal is connected to a first control signal line; a drain terminal of the first TFT is connected to a first power source line, and a source terminal of the first TFT is connected to an output signal line; a gate terminal of the second TFT is connected to a second control signal line, and a drain terminal of the second TFT is connected to a second power source line; the first TFT and the second TFT are formed with an inverted staggered structure, a top contact structure, or a bottom contact structure; and in the first TFT, a two-dimensionally overlapping area of a source electrode and a gate electrode is smaller than a two-dimensionally overlapping area of a drain electrode and the gate electrode, and the method includes: dividing a driving period of the image sensor to an integrating period where a light signal is irradiated to the pixels and to a readout period where a signal is read out from the pixels; making a gate voltage of the first TFT smaller than a source voltage of the first TFT in the integrating period; and making the gate voltage of the first TFT larger than the source voltage of the first TFT in the readout period.

As an exemplary advantage according to the invention, the present invention makes it possible to operate the image sensor of high S/N ratio at a high speed without generating an issue in terms of the reliability. Further, with the present invention, the manufacturing cost of the image sensor can be decreased.

DETAILED DESCRIPTION OF THE PREFERRED EMBODIMENTS

Figure 1:
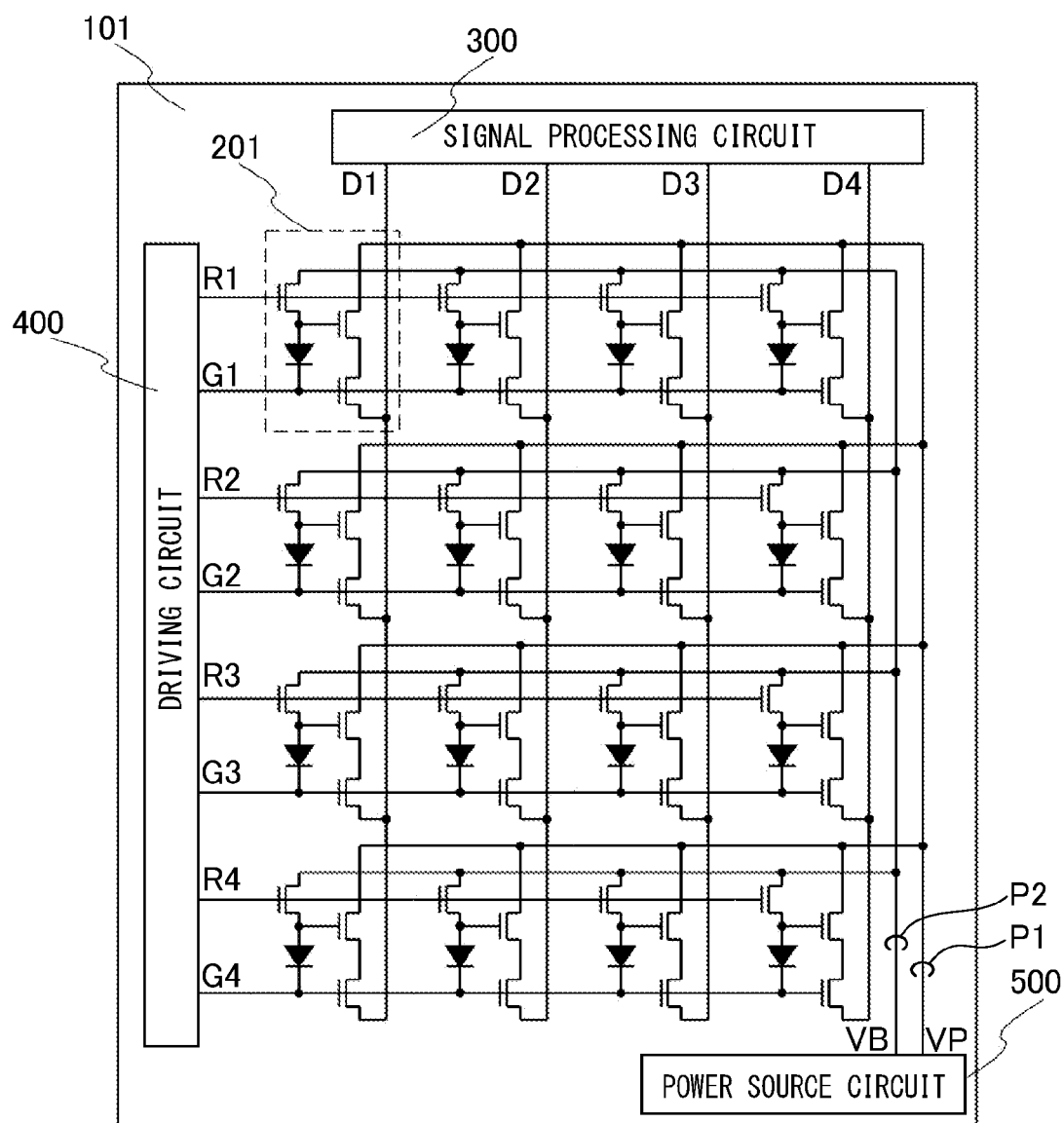
FIG. 1 is a block diagram showing the structure of an image sensor according to a first exemplary embodiment.

Modes for embodying the present invention (referred to as "exemplary embodiments" hereinafter) will be described by referring to the accompanying drawings. In the current Specification and the Drawings, same reference numerals are used for substantially the same structural elements.

First Exemplary Embodiment

An image sensor of a first exemplary embodiment will be described in details by referring to the accompanying drawings. The sizes and reduced scales of each structural element in each of the drawings are altered as appropriate for securing the visibility of the drawings. Further, it is to be noted that hatching in each of the drawings is applied for distinguishing each structural element and does not necessarily indicate a cut section.

A TFT 220, a TFT 230, a TFT 240, a scan line (first control signal line) Gn, a control line (second control signal line) Rn, a power source line P1, a power source line P2, and an output wiring (output signal line) Dm shown in FIG. 2 correspond to examples of "first TFT", "second TFT", "third TFT", "first control signal line", "second control signal line", "first power source line", "second power source line", and "output signal line", respectively, which are depicted in appended claims including the first to third TFTs.

FIG. 1 shows the structure of the image sensor according to the first exemplary embodiment. The image sensor 101 has the structure in which output wirings D1 to D4, scan lines G1 to G4, and control lines R1 to R4 are disposed on a substrate in a crosswise manner. At the positions sectioned by the output wirings D1 to D4 and the scan lines G1 to G4, pixels 201 are disposed in matrix. The output wirings D1 to D4 are connected to a signal processing circuit 300, and the scan lines G1 to G4 as well as the control lines R1 to R4 are connected to a driving circuit 400. Further, the power source line P1 (power source voltage VP) and the power source line P2 (power source voltage VB) connected in common to each of the pixels 201 are connected to a power source circuit 500. Although not shown, a phosphor which transforms X-rays to visible light is disposed on the upper part of the image sensor 101. While a case where the pixels 201 of the image sensor 101 are disposed by 4×4 in a crosswise manner is shown herein, it is needless to mention that the number of the pixels 201 can be changed as necessary.

Figure 2A:
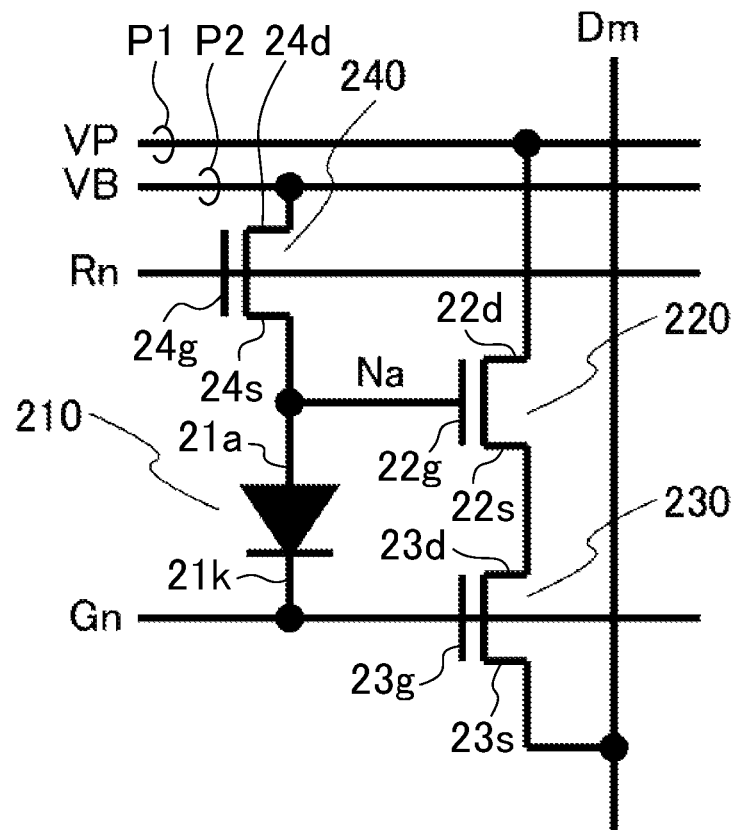
FIG. 2A is a circuit diagram showing the structure of a pixel of the image sensor according to the first exemplary embodiment.

FIG. 2A shows the structure of a pixel of the image sensor according to the first exemplary embodiment. In the pixel 201, a photodiode 210, an amplifying TFT (first TFT) 220, an output control TFT (second TFT) 230, and a reset TFT (third TFT) 240 are disposed. A cathode terminal 21$k$ of the photodiode 210 is connected to the scan line Gn, and an anode terminal 21$a$ is connected to the node Na. A gate terminal 22$g$ of the TFT 220 is connected to the node Na, a drain terminal 22$d$ is connected to the power source line P1 (power voltage VP), and a source terminal 22$s$ is connected to a drain terminal 23$d$ of the TFT 230. A gate terminal 23$g$ of the TFT 230 is connected to the scan line Gn, and a source terminal 23$s$ is connected to the output wiring Dm. A gate terminal 24$g$ of the TFT 240 is connected to the control line Rn, a drain terminal 24$d$ is connected to the power source line P2 (power voltage VB), and a source terminal 24$s$ is connected to the node Na.

Although not shown, a storage capacitance may be connected in parallel to the photodiode 210. For the semiconductor layer of the TFTs 220, 230, and 240, a-Si: H (amorphous silicon hydride) or oxide semiconductor can be used. For the photodiode 210, a-Si: H thin film can be used. In terms of the performance, it is particularly desirable to employ a structure in which p, i, n-type a-Si: H thin films are stacked.

Figure 2B:
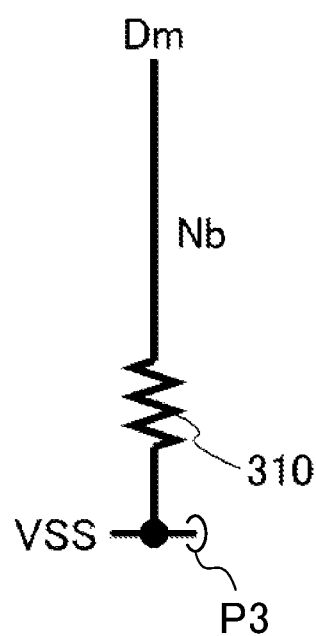
FIG. 2B is a circuit diagram of the structure (1) of a signal processing circuit that can be employed to the image sensor according to the first exemplary embodiment.

FIG. 2B shows a circuit example that can be employed to the signal processing circuit 300. The simplest circuit that can be employed to the signal processing circuit 300 is a circuit in which a resistance 310 whose one end is connected to the power source line P3 (power voltage VSS) is connected to the output wiring Dm. The resistance 310 forms a source follower circuit with the TFT 220 within the pixel 201, and a voltage according to the signal of the pixel 201 is outputted as the terminal voltage (voltage of the node Nb) of the resistance 310.

The driving circuit 400 is a circuit which has a function of outputting a pulse sequentially to the scan lines G1 to G4 and the control lines R1 to R4 in a period where the image sensor 101 outputs the signals of all the pixels 201, and it can be constituted with a shift register, for example.

The power source circuit 500 supplies a DC voltage required for the image sensor 101, and a typical power source circuit can be used for that.

The signal processing circuit 300, the driving circuit 400, and the power source circuit 500 may be constituted with TFTs on the image sensor substrate. Alternatively, circuits constituted with semiconductor chips may be COG (chip-on-glass) connected or connected via a cable.

Figure 3:
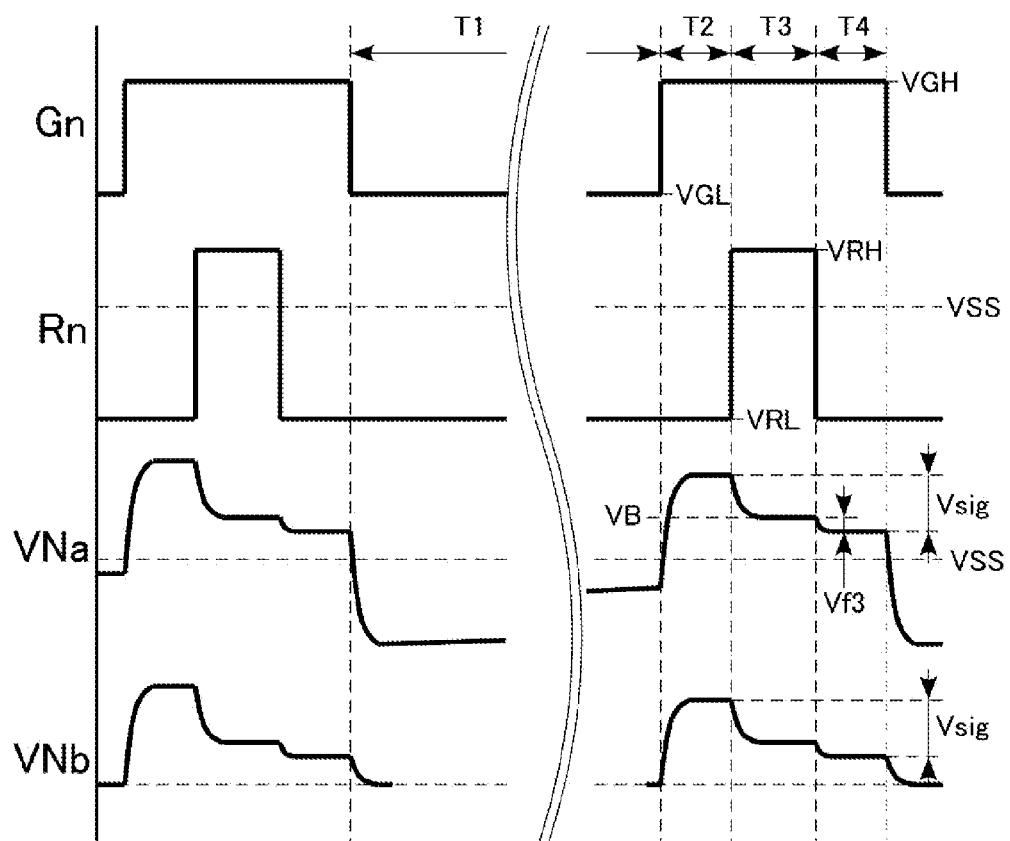
FIG. 3 is a timing chart showing operations of the image sensor according to the first exemplary embodiment.

Next, a method for setting the voltage of the scan line, the control line, and various kinds of power source lines will be described. FIG. 3 is a timing chart showing operations of the image sensor according to the first exemplary embodiment. The voltage of the scan line Gn is a pulse having a low potential level VGL and a high potential level VGH. The voltage of the control line Rn is a pulse having a low potential level VRL and a high potential level VRH.

In the image sensor 101, the photodiode 210 is operated as an accumulation type. Thus, it is necessary to apply a reverse bias to the photodiode 210. As the reverse bias voltage of the photodiode 210, it is possible to set the value of about VGH−VB by satisfying VGH>VB through applying VGH to the cathode terminal 21*k* and applying the power source voltage VB to the anode terminal 21*a*. As the degree of the value of the reverse bias voltage of the photodiode 210, a value with which the reverse voltage can be remained between the cathode and the anode even when the possible maximum light amount is irradiated is set as a criterion.

Next, the power source voltage VB, the pulse voltages VGL, VGH of the scan line Gn, and the power source voltage VSS of the signal processing circuit 300 are set to satisfy following expressions.

$$VB-\{Cd/(Cp+Cd)\}(VGH-VGL)+Qs\max/(Cp+Cd)-Vf3<VSS \quad (1)$$

$$VB-Vf3>VSS+Vth1 \quad (2)$$

Note here that Cd is the capacitance of the photodiode 210, Cp is the parasitic capacitance of other than the photodiode 210 connected to the node Na, Qsmax is the electric charge generated when the possible maximum light amount is irradiated to the photodiode 210, Vth1 is the threshold voltage of the TFT 220, and Vf3 is the feedthrough voltage generated in the node Na in accordance with switching of the TFT 240.

The pulse voltages VRL and VRH of the control line Rn are set to satisfy following expressions.

$$VRL<VB-\{Cd/(Cp+Cd)\}(VGH-VGL)-Vf3 \quad (3)$$

$$VRH>VB+Vth3 \quad (4)$$

Note here that Vth3 is the threshold voltage of the TFT 240. Further, the power source voltage VP is set to be equal to or larger than VB.

Next, the operations of the image sensor 101 will be described by using the timing chart of FIG. 3. The operations of the image sensor 101 can be mainly divided into two periods. One of the periods is an integrating period T1 where the signal electric charges according to the irradiating intensity of the X-ray are integrated. The other one is a readout period referred to as T2, T3, or T4 where the signals held at each of the pixels 201 are read out and the photodiode 210 is reset.

In the integrating period T1, X-ray is irradiated to an examination target, and the X-ray transmitted through the examination target is irradiated to the phosphor within the image sensor 101. In the phosphor, visible light of the light amount according to the amount of the irradiated X-ray is emitted. The visible light reaches the photodiode 210 of the pixel 201, and excites hole-electron pairs.

Since the control line Rn is in the low potential level VRL in the period T1, the TFT 240 is in an electrically disconnected state and the electric charge determined according to the reverse bias voltage and the capacitance of the photodiode 210 is accumulated in the photodiode 210. The hole-electron pairs excited by the light inside the photodiode 210 migrate by the inside electric field and become the electric current in the direction of decreasing the electric charges accumulated in the photodiode 210. Thus, the electric charges accumulated in the photodiode 210 are decreased by the amount according to the incident light amount.

Assuming that the electric charge decrease amount is Qs, the potential of the node Na is expressed as follows. Note that the anode terminal 21*a* of the photodiode 210 is connected to the node Na, so that it is necessary to keep in mind that the potential of the node Na is increased according to the decrease of the electric charges.

$$VNa=VB-\{Cd/(Cp+Cd)\}(VGH-VGL)+Qs/(Cp+Cd)-Vf3 \quad (5)$$

In the period T2 of the readout period, the potential of the scan line Gn is increased to VGH. Thereby, the TFT 230 comes to be in an electrically connected state. Further, the potential of the cathode terminal 21*k* of the photodiode 210 is increased, and the potential of the node Na is increased as well. The potential of the node Na in that state can be expressed as follows.

$$VNa=VB+Qs/(Cp+Cd)-Vf3 \quad (6)$$

Here, it can be found from the relation of Expression (2) that the value of VNa becomes larger than VSS+Vth1. At the instant when the period is switched to the period T2, the TFT 230 comes to be in an electrically connected state and the source voltage of the TFT 220 turns to VSS. Thus, the voltage between the gate and the source of the TFT 220 becomes equal to or larger than the threshold voltage of the TFT 220, so that an electric current flows between the drain and the source of the TFT 220.

In a case where the value of the resistance 310 of the signal processing circuit 300 is sufficiently large, the voltage of the node Nb can be expressed as follows.

$$VNb=VB+Qs/(Cp+Cd)-Vf3-Vth1 \quad (7)$$

It is supposed herein that the on-resistance of the TFT 230 is sufficiently smaller than the resistance value of the resistance 310. As it can be seen from the fact that Expression (7) contains member Qs, the voltage according to the intensity of the X-ray irradiated to the image sensor 101 can be detected at the node Nb.

In the period T3 of the readout period, the potential of the control line Rn is increased to VRH. VRH satisfies Expression (4), so that the voltage between the gate and the source of the TFT 240 becomes larger than the threshold voltage Vth3 of the TFT 240. Thus, the TFT 240 comes to be in an electrically connected state. As a result, the potential of the node Na turns to VB, and the voltages of the both ends of the photodiode 210 are also reset to VGH−VB.

In the period T4 of the readout period, the potential of the control line Rn is decreased to VRL. Upon that, the TFT 240 comes to be in an electrically disconnected state. However, at that time, the electric charge by feedthrough flows to the node Na, so that the potential of the node Na is decreased by the amount of the feedthrough voltage Vf3, which can be expressed as follows.

$$VNa=VB-Vf3 \quad (8)$$

In the period T4, the TFT 230 is remained in an electrically connected state. Thus, the potential of the node Nb can be expressed as follows.

$$VNb=VB-Vf3-Vth1 \quad (9)$$

From Expressions (7) and (9), a following voltage can be acquired for a differential voltage Vsig between the voltage of the node Nb in the period T2 and the voltage of the node Nb in the period T4.

$$Vsig=Qs/(Cp+Cd) \quad (10)$$

As can be seen from Expression (10), it is possible to acquire the signal voltage Vsig that does not contain the threshold voltage Vth1 of the TFT 220 and the feedthrough voltage Vf3 of the TFT 240.

With the first exemplary embodiment, it is possible to operate the image sensor of the high S/N ratio at a high speed without having a problem in terms of the reliability. The reasons thereof will be described by dividing those to (a), (b), (c), and (d) in the followings.

(a) With the image sensor 101, it is possible to increase the S/N ratio. The reason is that the TFT 220 for amplification is provided to each of the pixels 201 and the signal is read out with the voltage.

When the signal of the pixel 201 is read out as the electric charge, an extremely small electric current flowing in the output wiring Dm needs to be detected by an integrator or the like. The electric current flowing in the output wiring Dm includes not only the electric current depending on the signal electric charge but also the electric current according to the potential fluctuation of another wiring that is capacitance-coupled to the output wiring Dm, the electric current according to the change in the electromagnetic field in the periphery of the output wiring Dm, and the like. The electric currents other than the signals are extremely small values. However, the signal electric charges are also about fC (femto-coulomb), so that it cannot be ignored.

In the meantime, with the image sensor 101, the signal electric charge is transformed to the voltage at the amplifying TFT 220. Thus, it is possible to take it out as a larger signal voltage than the voltage component generated with the electric current of the other than the signal by the resistance 310 of the signal processing circuit 300. Therefore, it is possible to acquire a high S/N ratio.

(b) Further, with the image sensor 101, the voltage Vsig acquired as the signal does not contain the threshold voltage Vth1 of the TFT 220 and the feedthrough voltage Vf3 according to switching of the TFT 240.

The threshold voltage of the TFT varies depending on the variation generated in the manufacturing process. The feedthrough voltage depends on the two-dimensionally overlapping area of the source electrode and the gate electrode of the TFT, so that there are variations generated in the manufacturing process.

However, with the image sensor 101, the signal voltage does not contain those. This, there is no variation in the offset of the signal level of individual pixel 201, and no FPN (fixed pattern noise) is generated.

(c) With the image sensor 101, there is no adverse effect imposed upon the reliability even when the amplifier circuit by the TFT 220 is provided.

In a case where a-Si or an oxide semiconductor is used as the TFT, the threshold voltage fluctuates when the voltage is continuously applied between the gate and the source of the TFT. In the amplifier circuit employed to the typical image sensor, a positive voltage is continuously applied between the gate and the source of the amplifying TFT at all times.

Figure 4:
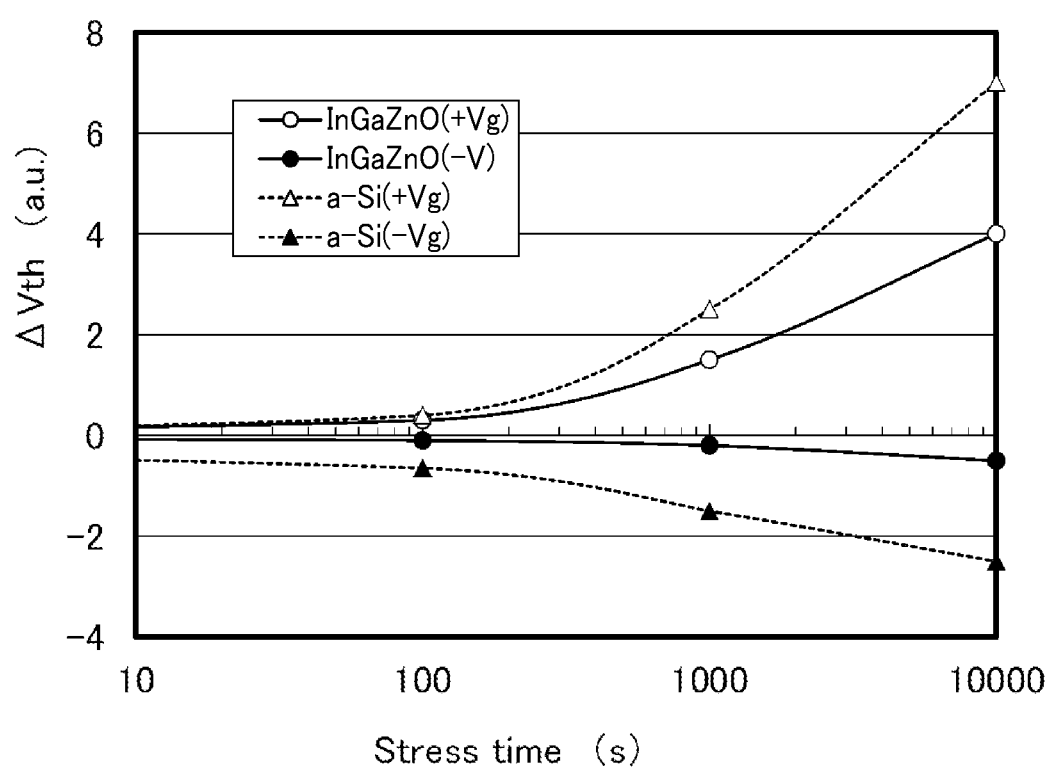
FIG. 4 is a graph showing the measured result of stress applying time between the gate and the source and threshold voltage fluctuation amount in a case of a-Si TFT and oxide semiconductor (InGaZnO) TFT.

FIG. 4 shows the result acquired by fabricating TFTs formed by a-Si: H and an oxide semiconductor (InGaZnO: compound of In, Ga, Zn, and O), applying positive voltages and negative voltages between the gate and the source, and evaluating the changes in the threshold voltage of the TFTs. Lines marked with a-Si (+Vg) and a-Si (−Vg) show the changes in the threshold voltage when a positive voltage stress and a negative voltage stress are applied between the gate and the source of the a-Si: H TFT, respectively. Lines marked with InGaZnO (+Vg) and InGaZnO (−Vg) show the changes in the threshold voltage when a positive voltage stress and a negative voltage stress are applied between the gate and the source of the oxide semiconductor TFT, respectively.

As can be seen from FIG. 4, it is found that the changes in the threshold value of the TFT are greater both in the cases of a-Si: H and the oxide semiconductor when the positive voltage stress is applied between the gate and the source of the TFT. Thus, with the conventional image sensors, the threshold voltage of the amplifying TFT fluctuates largely. Accordingly, the signal voltage is fluctuated greatly, thereby causing a problem in terms of the reliability.

In the meantime, as can be seen from FIG. 3, with the image sensor 101, the potential of the node Na that is the gate voltage of the amplifying TFT 220 is smaller than VSS in the integrating period T1. Note here that the source potential of the amplifying TFT 220 is VSS or a higher potential than VSS, so that the gate-source voltage is negative.

Subsequently, the length of the integrating period T1 and the lengths of the readout periods T2, T3, and T4 will be discussed. The signals of all the pixels 201 connected to a single output wiring Dm are read out within the total period of T1, T2, T3, and T4 of FIG. 3. That is, assuming that the number of the pixels 201 connected to the single output wiring Dm is n, the length of T1 is more than n-times the total length of T2, T3, and T4. For example, with FPD used for taking chest X-ray photographs, n is 1000 or larger. Thus, the length of T1 is extremely longer than the lengths of T2, T3, and T4.

Therefore, in most of the time of the operation period of the image sensor 101 according to the first exemplary embodiment, a negative voltage is continuously applied between the gate and the source of the amplifying TFT 220.

As shown in FIG. 4, the fluctuation in the threshold voltage of the TFT is smaller when the gate-source voltage is negative. Further, when the TFT is fabricated with an oxide semiconductor, the threshold voltage hardly fluctuates. Thus, with the image sensor 101, it is possible to greatly suppress the bad influence upon the reliability or to have no such bad influence.

(d) It is possible with the image sensor 101 to operate at a high speed.

The signal readout speed of the image sensor 101 provided to each pixel of the amplifying TFT 220 depends on the current driving capacity of the amplifying TFT 220 and the parasitic capacitance of the output wiring Dm. With the techniques disclosed in Patent Documents 5 and 6, when the channel width of the TFT is increased for improving the current driving capacity of the amplifying TFT, the parasitic capacitance of the output wiring becomes increased so that the signal reading out speed cannot be improved.

In the meantime, with the image sensor 101, the gate-source capacitance of the amplifying TFT 220 does not become the parasitic capacitance of the output wiring Dm. It is because the output control TFT 230 becomes electrically disconnected in a case of an unselected pixel 201. The gate-source capacitance of the TFT 230 becomes the parasitic capacitance of the output wiring Dm. However, the on-resistance can be made smaller by setting the gate-source voltage to be higher, and it is possible to use a TFT of small channel width. Thus, the gate-source capacitance of the TFT 230 can be made smaller, thereby making it possible to decrease the parasitic capacitance of the output wiring Dm.

Therefore, the signal reading out speed can be improved, so that high-speed operation can be performed. The gate-source voltage of the TFT 230 can be set by increasing the value of VGH. Through setting VGH to have a large value, the voltages (reverse bias voltages) at both ends of the photodiode 210 are increased. However, VGH may be set within a range with which the leak current of the photodiode 210 does not increase.

Next, the signal processing circuit 300 used for the image sensor 101 will be described.

Other than the one using the resistance 301 as already has been described above, a circuit shown in FIG. 5A can be used as the signal processing circuit 300. This circuit is the one in which an active load constituted with a MOS transistor 331 is connected to the output wiring Dm instead of the resistance 310. A MOS transistor 332 and a current source 320 are for generating the bias voltage that is supplied to a gate terminal 33g of the MOS transistor 331. The same number of MOS transistors 331 as that of the output wirings Dm of the image sensor 101 are required. However, it is sufficient to have at least one each for the MOS transistor 332 and the current source 320.

The signal processing circuit 300 using the active load can also be constituted by using a bipolar transistor. A bipolar transistor 341 of FIG. 5B is the transistor to be the active load, and a bipolar transistor 342 and the current source 320 supply a base voltage to a base terminal 34b of the bipolar transistor 341.

Figure 5A:
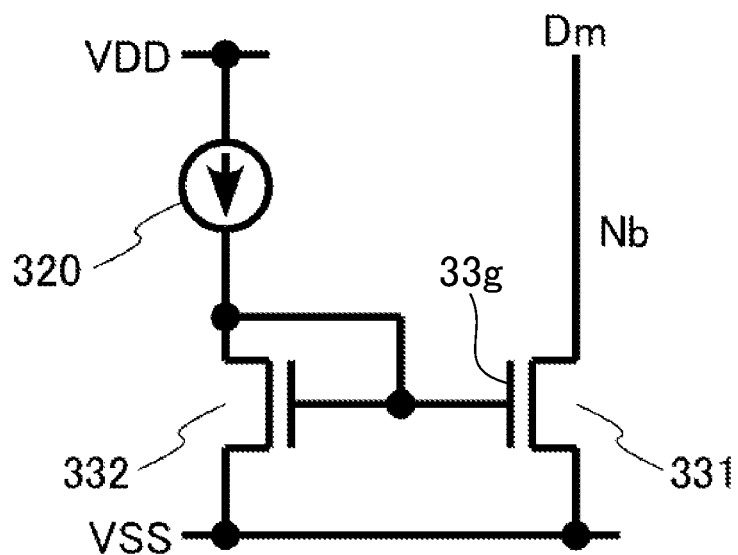
FIG. 5A is a circuit diagram of the structure (2) of a signal processing circuit that can be employed to the image sensor according to the first exemplary embodiment.
Figure 5B:
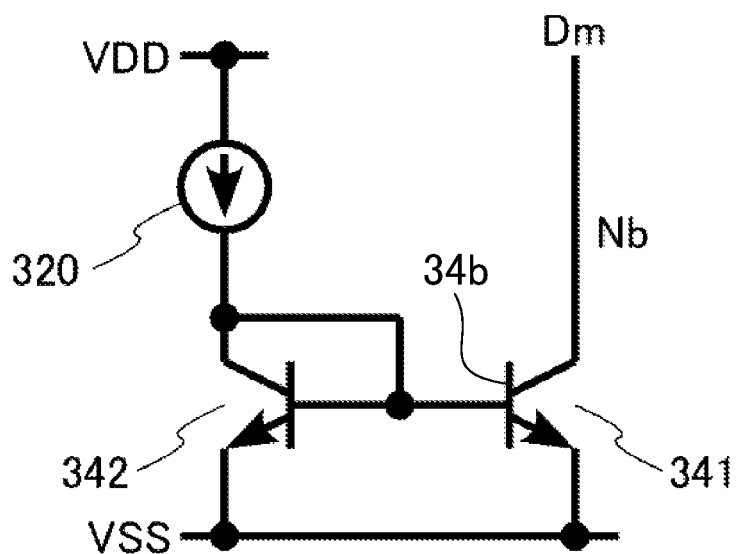
FIG. 5B is a circuit diagram of the structure (3) of a signal processing circuit that can be employed to the image sensor according to the first exemplary embodiment.

By using the circuits shown in FIG. 5A and FIG. 5B, the chip area can be formed smaller compared to the case of using the resistance 310 when the signal processing circuits 300 are integrated on a semiconductor chip.

The resistance 310 and the MOS transistor 331 to be the active load as well as the bipolar transistor 341 of the signal processing circuit 300 constitute a source follower circuit along with the TFT 220 in the pixel 201, and the resistance value thereof determines the gain of the source follower circuit. In the explanations heretofore, the gain of the source follower circuit is "1" by supposing that the resistance value is extremely high. However, when the resistance value is high, the time constant when decreasing the voltage of the node Nb becomes large. Thus, by setting the value of the resistance 310 and the current value of the current source 320 according to the operation speed required for the image sensor 101, it is possible to adjust to the proper gain and response speed. Further, when it is desired to increase the response speed while keeping the gain of the follower circuit close to "1", a switch for short-circuiting the node Nb to the power source voltage VSS may be provided in parallel to the resistance 310, the MOS transistor 331 to be the active load, or the bipolar transistor 341.

In the explanation of the operation of the image sensor 101, it is shown that the signal voltage Vsig containing no threshold voltage Vth1 of the TFT 220 and no feedthrough voltage Vf3 at the time of switching the TFT 240 can be acquired by comparing the pixel signals outputted in a time sequence. This operation can be achieved by adding the sampling circuit shown in FIG. 6 to the node Nb of the signal processing circuit 300.

Figure 6:
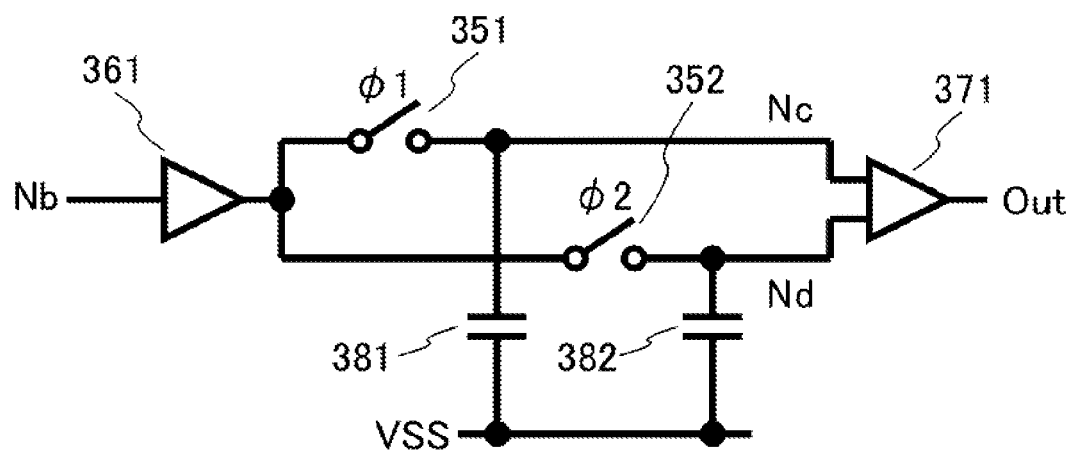
FIG. 6 is a circuit diagram showing the structure of a sampling circuit that can be mounted into a signal processing circuit that can be employed to the image sensor according to the first exemplary embodiment.
Figure 7:
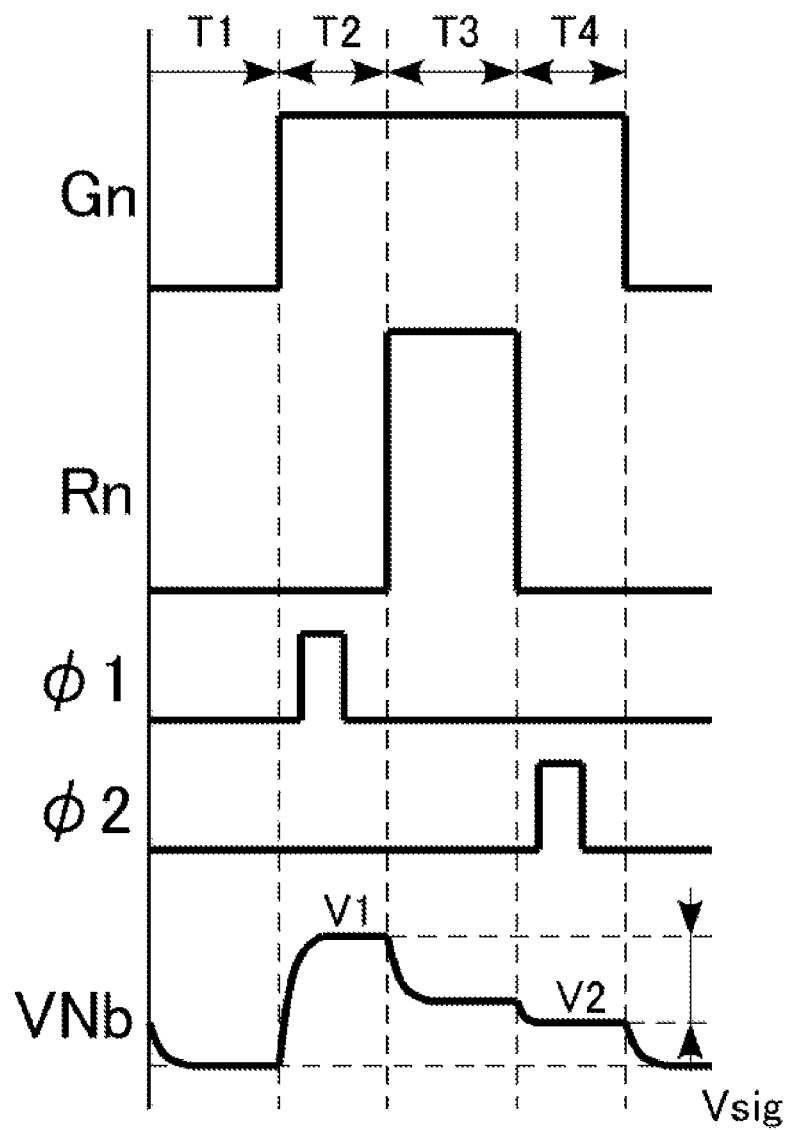
FIG. 7 is a timing chart showing operations of the sampling circuit of FIG. 6.

The circuit shown in FIG. 6 is constituted with switch elements 351, 352, an analog buffer 361, a differential amplifier 371, and capacitances 381, 382. This is operated at the timings shown in FIG. 7. φ1 and φ2 show the timings at which the switch elements 351 and 352 are electrically connected, respectively, and those elements become electrically connected in high-level time. Upon that, the voltage V1 of the node Nb in the time where φ1 is transited to low level in the period T2 is held to the capacitance 381, and the voltage V2 of the node Nb in the time where φ2 is transited to low level in the period T4 is held to the capacitance 382. The difference Vsig of the voltages held by the two capacitances 381 and 382 is outputted from the output terminal Out of a differential amplifier 371. While the gain of the differential amplifier 371 is defined as "1", there is no problem even if it is larger than 1.

Further, a sample hold circuit, an ADC (analog-digital converter) circuit, or the like may be connected to the output terminal Out of the differential amplifier 371. However, those structures are not related to the essential substance of the present invention, so that explanations thereof are omitted.

The above explanations can be summarized as follows. The essential substance of the image sensor 101 is to: provide the gate-source voltage of the amplifying TFT 220 to each of the pixels 201 and make the gate-source voltage of the amplifying TFT 220 negative in most of the period when operating the image sensor 101; and dispose the output control TFT 230 between the amplifying TFT 220 and the output wiring Dm so that the gate-source capacitance of the amplifying TFT 230 does not become the parasitic capacitance of the output wiring Dm. This makes it possible to operate the image sensor 101 of the high S/N ratio at a high speed without having a problem in terms of the reliability.

Second Exemplary Embodiment

Figure 8:
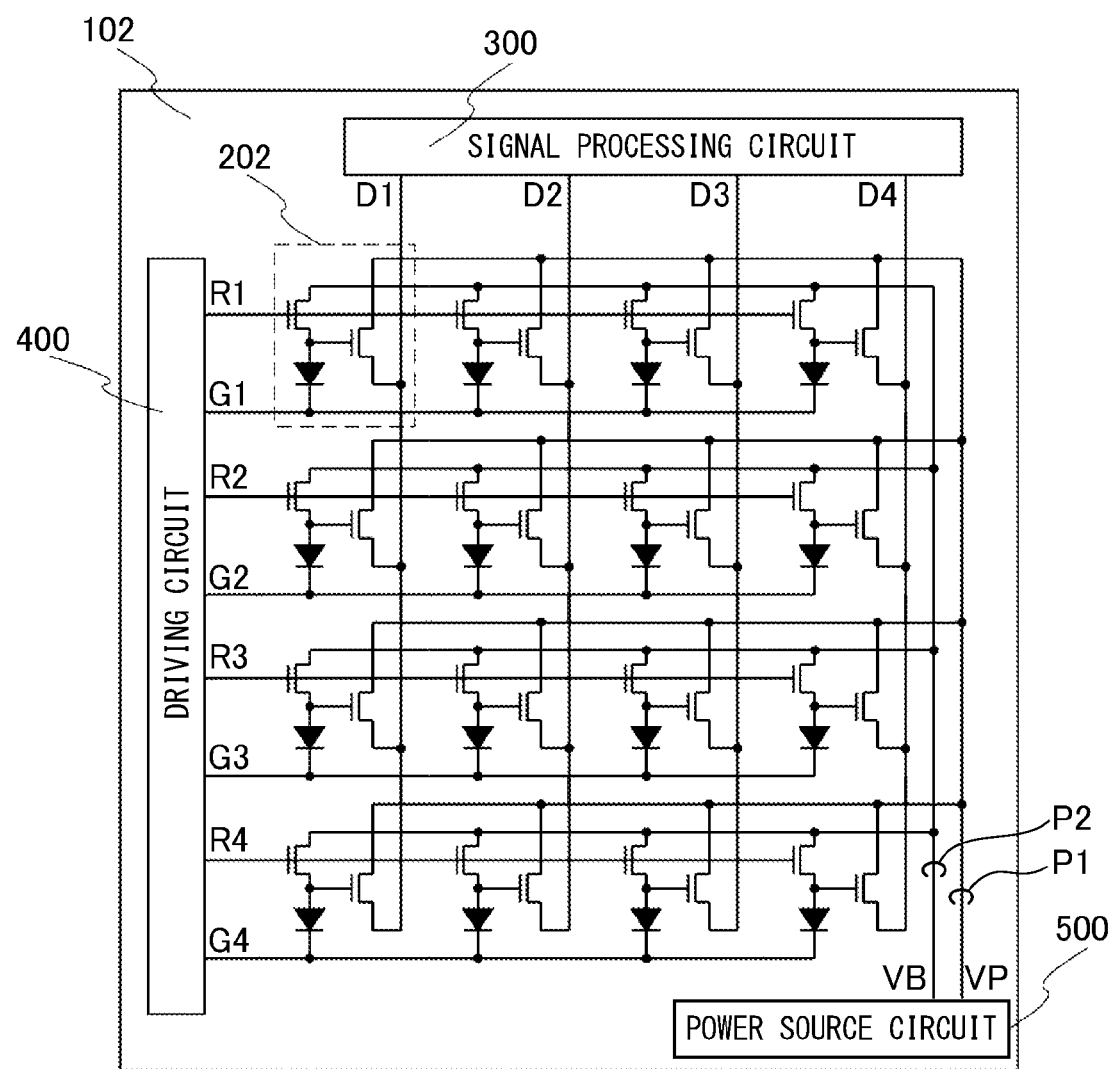
FIG. 8 is a block diagram showing the structure of an image sensor according to a second exemplary embodiment.

A TFT 220, a TFT 240, a scan line Gn, a control line Rn, a power source line P1, a power source line P2, an output wiring Dm, a border line B-B', a border line C-C', a semiconductor layer 630, a drain electrode 641, and a source electrode 642 shown in FIG. 8 and FIG. 11 correspond to examples of "first TFT", "second TFT", "first control signal line", "second control signal line", "first power source line", "second power source line", "output signal line", "first border line", "second border line", "channel region", "drain region", and "source region", respectively, which are depicted in appended claims including first and second TFTs and not including the third TFT.

FIG. 8 shows the structure of the image sensor according to the second exemplary embodiment. The image sensor 102 has the structure in which output wirings D1 to D4, scan lines G1 to G4, and control lines R1 to R4 are disposed on a substrate in a crosswise manner. At the positions sectioned by the output wirings D1 to D4 and the scan lines G1 to G4, pixels 202 are disposed in matrix. The output wirings D1 to D4 are connected to a signal processing circuit 300, and the scan lines G1 to G4 as well as the control lines R1 to R4 are connected to a driving circuit 400. Further, the power source line P1 (power source voltage VP) and the power source line P2 (power source voltage VB) connected in common to each of the pixels 202 are connected to a power source circuit 500. Although not shown, a phosphor which transforms X-rays to visible light is disposed on the upper part of the image sensor 102. While the image sensor 102 of FIG. 8 shows a case where the pixels 202 are disposed by 4×4 in a crosswise manner, the number of the pixels 202 can be changed as necessary.

Figure 9:
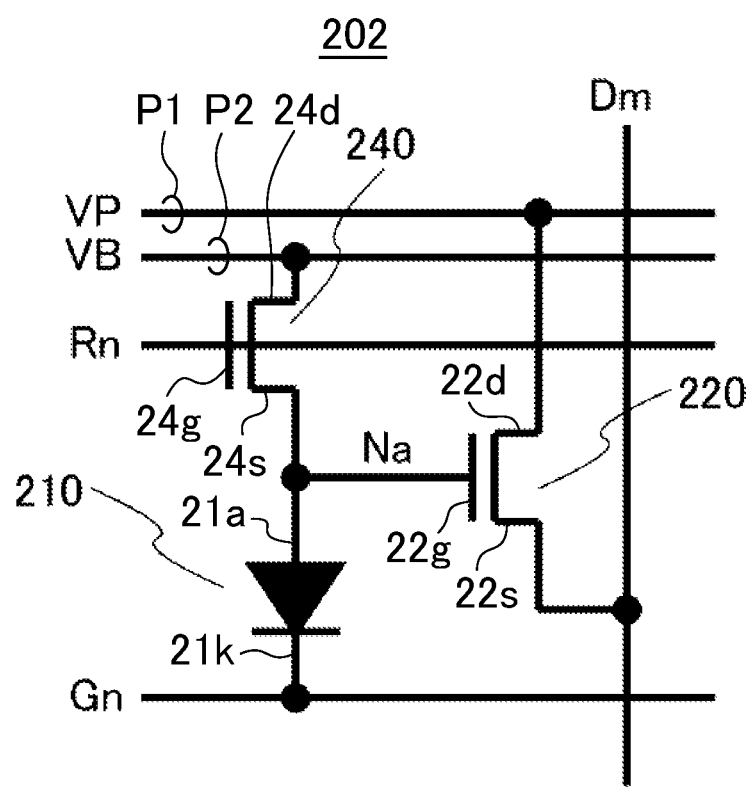
FIG. 9 is a circuit diagram showing the structure of a pixel of the image sensor according to the second exemplary embodiment.

FIG. 9 shows the structure of a pixel of the image sensor according to the second exemplary embodiment. In the pixel 202, a photodiode 210, the amplifying TFT (first TFT) 220, and a reset TFT (second TFT) 240 are disposed. A cathode terminal 21k of the photodiode 210 is connected to the scan line Gn, and an anode terminal 21a is connected to the node Na. A gate terminal 22g of the TFT 220 is connected to the node Na, a drain terminal 22d is connected to the power source line P1 (power source voltage VP), and a source terminal 22s is connected to the output wiring Dm. A gate terminal 24g of the TFT 240 is connected to the control line Rn, a drain terminal 24d is connected to the power source line P2 (power source voltage VB), and a source terminal 24s is connected to the node Na.

Although not shown, a storage capacitance may be connected in parallel to the photodiode 210. The TFTs 220 and 240 are in an inverted staggered structure, and a-Si: H or oxide semiconductor can be used for the semiconductor layer thereof. For the photodiode 210, a-Si: H thin film can be used. In terms of the performance, it is particularly desirable to employ a structure in which p, i, n-type a-Si: H thin films are stacked.

Figure 10A:
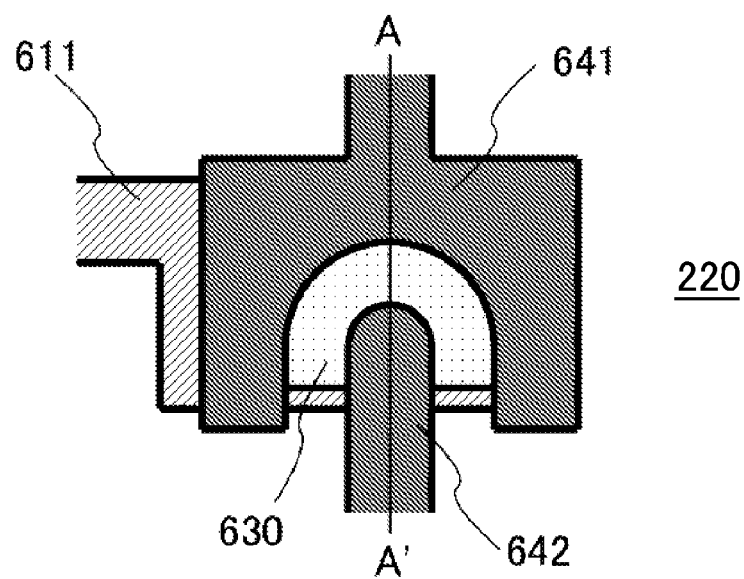
FIG. 10A is a plan view showing the shape of TFT that can be employed to the image sensor of the second exemplary embodiment.

FIG. 10A is a plan view showing the structure of the amplifying TFT 220 which is provided to the pixel 202 of the image sensor 102. The TFT 220 is in an inverted staggered structure, which includes a gate electrode 611, a semiconductor layer 630, a drain electrode 641, and a source electrode 642.

Figure 10B:
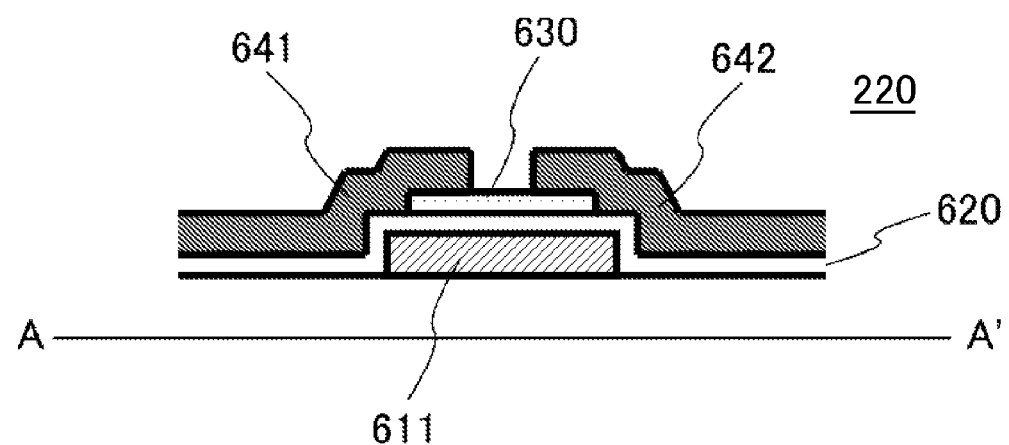
FIG. 10B is a sectional view showing the structure of TFT that can be employed to the image sensor of the second exemplary embodiment.

FIG. 10B shows a sectional view of a part taken along an A-A' line of FIG. 10A. The TFT 220 has a structure in which a gate insulating film 620, a semiconductor layer 630, a drain electrode 641, and a source electrode 642 are stacked and patterned on a gate electrode 611 that is formed on the substrate.

Figure 11A:
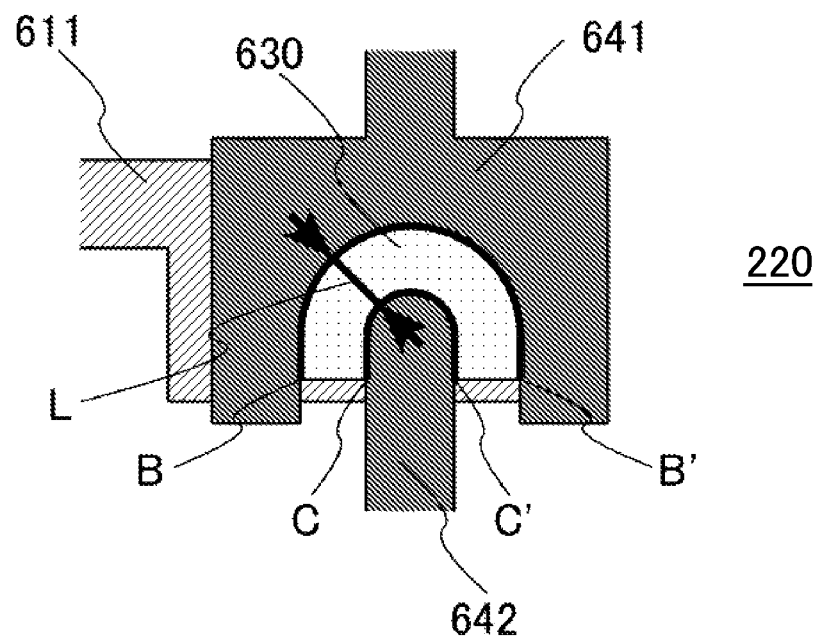
FIG. 11A is a plan view showing the characteristic shape of TFT that can be employed to the image sensor of the second exemplary embodiment.

The structure of the TFT 220 used herein is characterized as shown in FIG. 11A. In the structure, the border line B-B' between the drain electrode 641 and the semiconductor layer 630 that forms the channel region and the border line C-C' between the source electrode 642 and the semiconductor layer 630 that forms the channel region both include a curve part. The space between the border line B-B' and the border line C-C' is equivalent, and the space is the channel length L of the TFT 220. Further, comparing the length of the border line B-B' and the border line C-C', it can be characterized that the length of the border line B-B' is longer.

For the signal processing circuit 300, the driving circuit 400, and the power source circuit 500, the same circuits used in the image sensor of the first exemplary embodiment can be used, respectively.

Next, a method for setting various kinds of voltages and operations will be described. The operations of the image sensor 102 can be described by referring to the timing chart of FIG. 3.

First, various kinds of voltages are set in the following manner. The reverse bias voltage of the photodiode 210 can be set as about VGH−VB by adjusting the high potential level VGH of the scan line Gn and the power source voltage VB. It is assumed herein that a relation of VGH>VB is satisfied. The power source voltage VB and the low potential level VGL as well as the high potential level VGH of the scan line Gn are set to satisfy Expression (1) and (2). The low potential level VRL and the high potential level VRH of the control line Rn are set to satisfy Expressions (3) and (4). The definitions of symbols in Expressions are same as those of the first exemplary embodiment. The power source voltage VP is set to satisfy VP>VB.

Next, the operations of the image sensor 102 will be described. The operations of the image sensor 102 can be mainly divided into two periods. One of the periods is an integrating period T1 where the signal electric charges according to the irradiating intensity of the X-ray are integrated. The other one is a readout period referred to as T2, T3, or T4 where the signals held at each of the pixels 202 are read out and the photodiode 210 is reset.

In the integrating period T1, the control line Rn is in a low potential level. Thus, the TFT 240 is in an electrically disconnected state. Therefore, the electric charges accumulated in the both ends of the photodiode 210 decrease according to the amount of the X-ray irradiated to the pixel 202. Assuming that the decrease amount of the electric charges is Qs, the potential VNa of the node Na can be expressed as in Expression (5).

In the period T2 of the readout period, the potential of the scan line Gn is increased to VGH and the potential of the cathode terminal 21k of the photodiode 210 is also increased. The potential VNa of the node Na in that state can be expressed as in Expression (6). Note here that the relation of Expression (2) applies for VB, VSS, and Vf3. Thus, VNa becomes larger than VSS+Vth1, and the TFT 220 is in an electrically connected state.

In a case where the circuit shown in FIG. 2B is used as the signal processing circuit 300 and the value of the resistance 310 is sufficiently large, the voltage of the node Nb can be expressed as in Expression (7).

In period T3 of the readout period, the potential of the control line Rn is increased to VRH. VRH satisfies Expression (4), so that the voltage between the gate and the source of the TFT 240 becomes larger than the threshold voltage Vth3 of the TFT 240. Thus, the TFT 240 comes to be in an electrically connected state. As a result, the potential of the node Na turns to VB, and the voltages of the both ends of the photodiode 210 are also reset to VGH−VB.

In the period T4 of the readout period, the potential of the control line Rn is decreased to VRL. Upon that, the TFT 240 comes to be in an electrically disconnected state. However, at that time, the electric charge by feedthrough flows to the node Na, so that the potential of the node Na is decreased by the amount of the feedthrough voltage Vf3, which can be expressed as in Expression (8). From Expression (2), it can be found that the potential in Expression (8) is larger than VSS+Vth1. In that state, the TFT 220 is in an electrically connected state, so that the potential of the node Nb can be expressed as in Expression (9).

From Expressions (7) and (9), a differential voltage Vsig between the voltage of the node Nb in the period T2 and the voltage of the node Nb in the period T4 can be expressed as in Expression (10).

As can be seen from Expression (10), it is possible to acquire the signal voltage Vsig that does not contain the threshold voltage Vth1 of the TFT 220 and the feedthrough voltage Vf3 of the TFT 240.

With the second exemplary embodiment, it is possible to operate the image sensor 102 of the high S/N ratio at a high speed without having a problem in terms of the reliability. Further, the manufacturing cost can be decreased. The reasons thereof will be described.

With the image sensor 102, it is possible to increase the S/N ratio. The reason is the same as the case of the first exemplary embodiment.

With the image sensor 102, there is no adverse effect imposed upon the reliability even when the amplifier circuit by the TFT 220 is provided. The reason is also the same as the case of the first exemplary embodiment.

With the image sensor 102, high-speed operations can be achieved. In a case where the amplifying TFT 220 provided to the pixel 202 constitutes a source follower circuit, the signal response speed depends on the current driving capacity of the amplifying TFT 220 and the parasitic capacitance of the output wiring Dm. In the case where the source terminal 22s of the amplifying TFT 220 is connected to the output wiring Dm as in the case of the second exemplary embodiment, the parasitic capacitance of the output wiring Dm greatly depends on the gate-source capacitance of the amplifying TFT 220. The gate-source capacitance of the TFT 220 in the case of the inverted staggered TFT depends on the two-dimensionally overlapping area of the source electrode and the gate electrode.

Figure 11B:
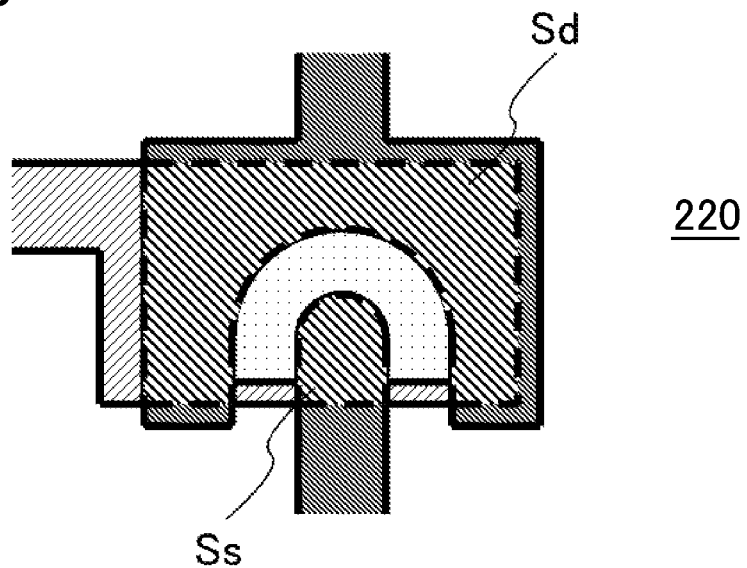
FIG. 11B is a plan view showing two-dimensionally overlapping state of a gate electrode, a source electrode, and a drain electrode of a TFT that can be employed to the image sensor of the second exemplary embodiment.

FIG. 11B show the overlapping area Ss of the gate electrode 611 and the source electrode 642 in the amplifying TFT 220 that is provided to the pixel 202 of the image sensor 102 and the overlapping area Sd of the gate electrode 611 and the drain electrode 641. As evident from the drawing, Sd is large, and Ss is smaller than that. Thus, the gate-source capacitance of the TFT 220 can be made small, so that the parasitic capacitance of the output wiring Dm becomes small. Thereby, high-speed operations can be achieved.

For the image sensor 102, an inverted staggered type a-Si: H TFT or an oxide semiconductor TFT can be used. With the inverted staggered type TFT, the photolithography process at the time of manufacture can be reduced compared to the case of the planar type TFT. It is because the process for forming the contact hole which electrically connects the semiconductor layer and the source metal as well as the drain metal is not required. However, the gate-source capacitance and the gate-drain capacitance of the inverted staggered type TFT become larger than those of the planar type TFT. In a case where the TFT structure of the second exemplary embodiment is used, it is possible to decrease the gate-source capacitance even with the use of the inverted staggered type TFT. Therefore, it is possible to achieve low-cost and high-speed operations at the same time.

Through forming the amplifying TFT 220 in the shape shown in FIG. 10A as in the case of the image sensor 102, high-speed operations can be achieved without disposing the output control TFT between the amplifying TFT 220 and the output wiring Dm. However, with a circuit simulation done by the inventor of the present invention, it is confirmed that the operation speed becomes slower than the image sensor of the first exemplary embodiment when the number of pixels connected to a single output wiring is increased. Therefore, the structure of the second exemplary embodiment is suited for a case where the image sensor 102 in which not so many pixels 202 are connected to a single output wiring is produced at a low cost.

Third Exemplary Embodiment

Figure 12:
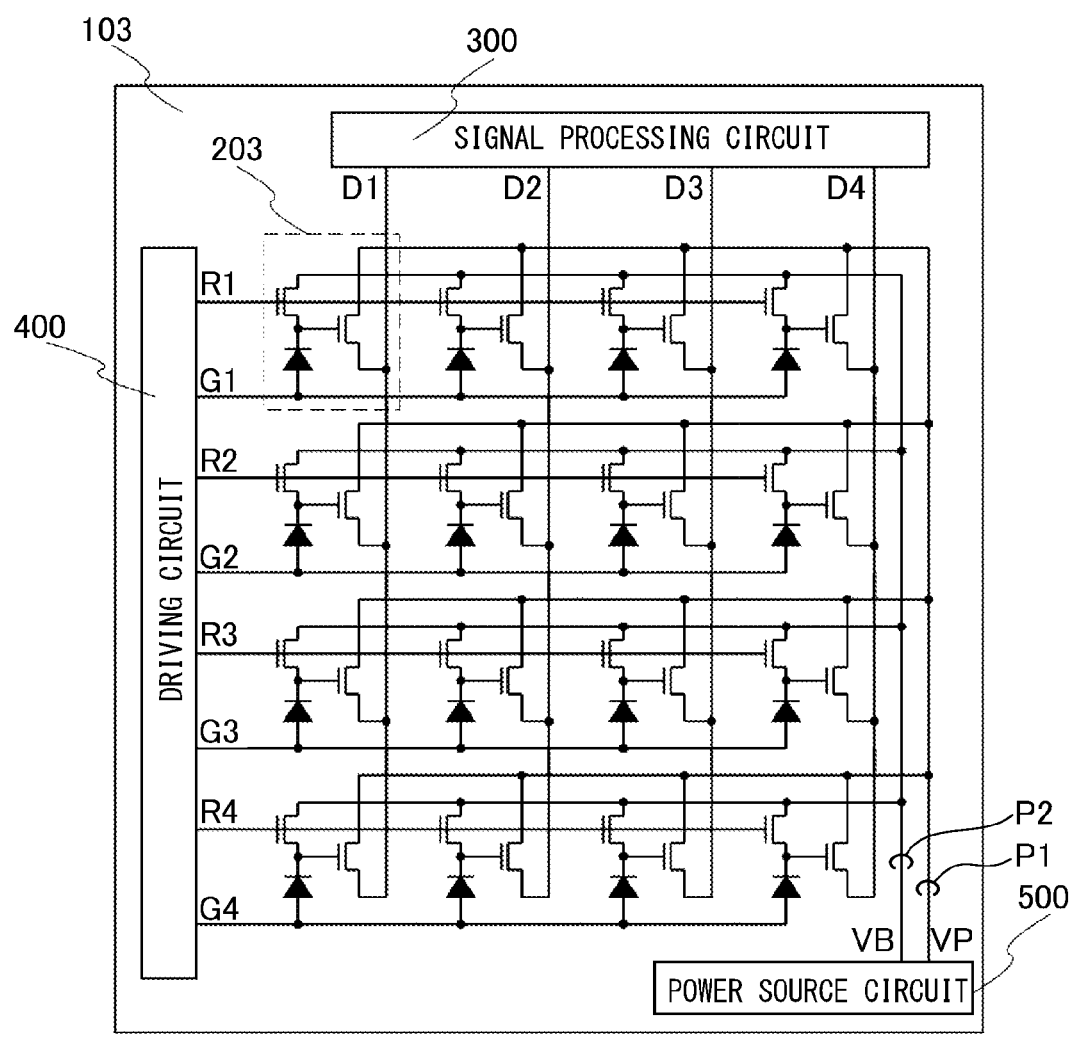
FIG. 12 is a block diagram showing the structure of an image sensor according to a third exemplary embodiment.
Figure 13:
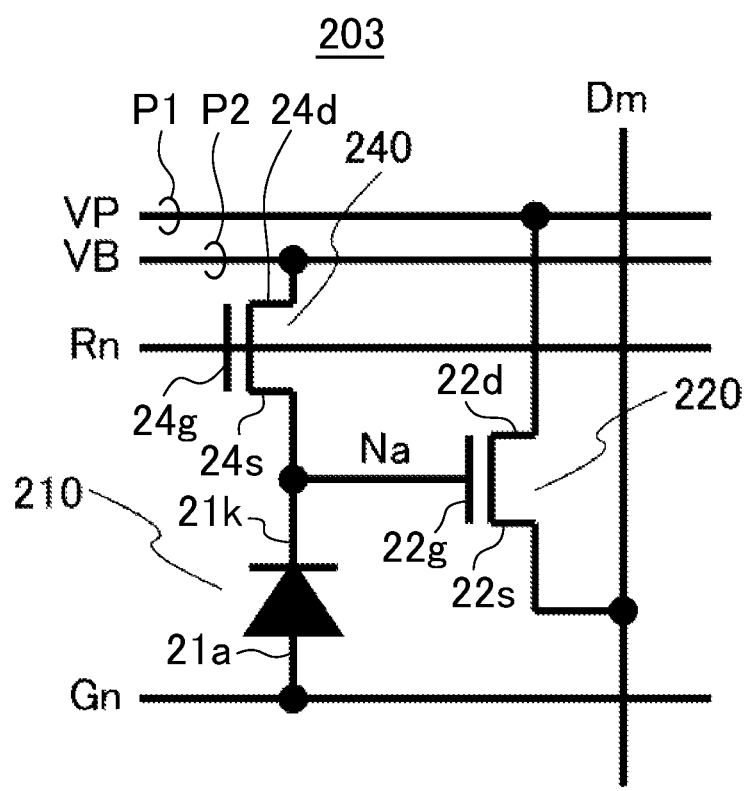
FIG. 13 is a circuit diagram showing the structure of a pixel of the image sensor according to the third exemplary embodiment.

FIG. 12 shows the structure of an image sensor according to a third exemplary embodiment. The structure of the image sensor 103 is almost the same as the structure of the second exemplary embodiment. The different point is the connecting method of the photodiode 210 as it can be seen from the circuit diagram of the pixel 203 shown in FIG. 13. In the image sensor 103, an anode terminal 21a of the photodiode 210 is connected to the scan line Gn, and a cathode terminal 21k is connected to the node Na. For the TFTs 220 and 240, an inverted staggered type a-Si: H TFT or an oxide semiconductor TFT can be employed. As the shape of the TFT 220, the one shown in FIG. 10A can be used.

For the signal processing circuit 300, the driving circuit 400, and the power source circuit 500 used for the image sensor 103, the same structures shown in the first exemplary embodiment can be used, respectively.

Figure 14:
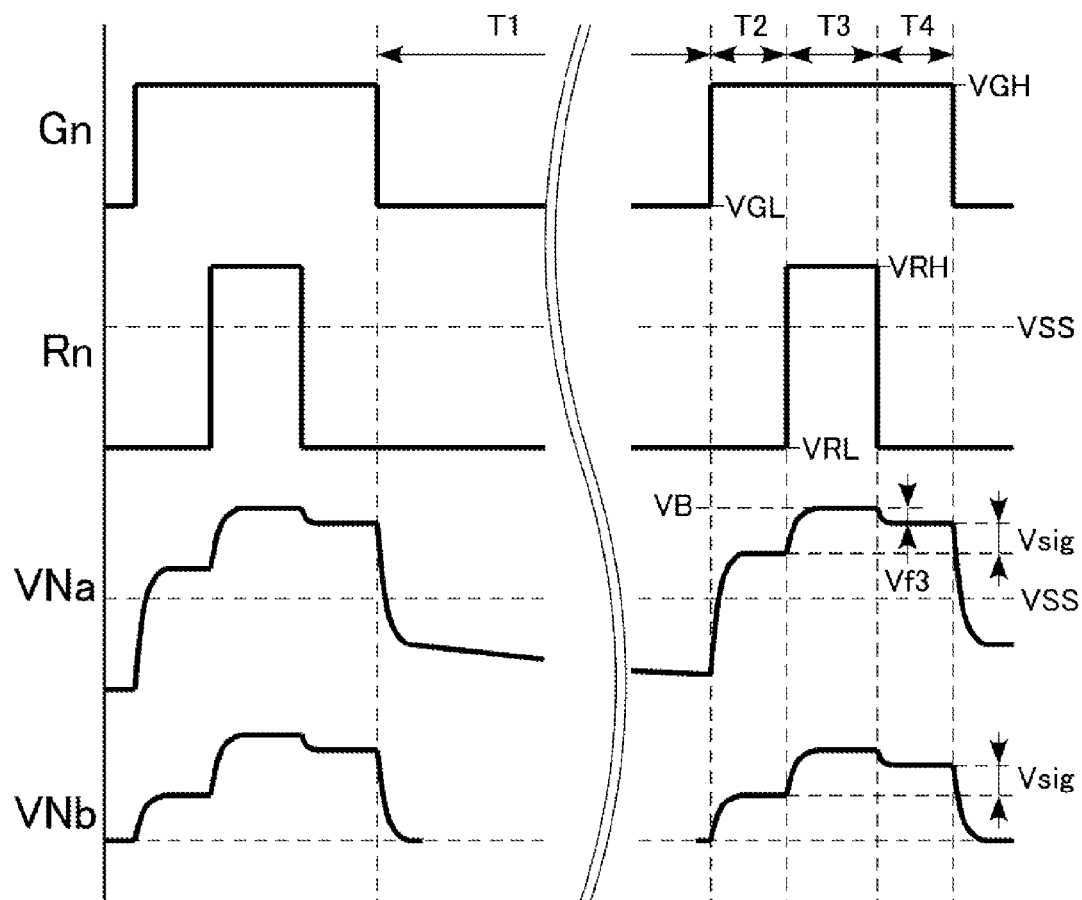
FIG. 14 is a timing chart showing operations of the image sensor of the third exemplary embodiment.

Next, a method for setting various kinds of voltages and operations will be described by referring to the timing chart of FIG. 14.

The reverse bias voltage of the photodiode 210 can be set as about VGH−VB by adjusting the power source voltage VB and the high potential level VGH of the scan line Gn. It is assumed herein that VB>VGH is satisfied. The potentials VB, VGH, and VGL are set to satisfy Expressions (11) and (12). The definitions of symbols in Expressions are same as those of the first exemplary embodiment.

$$VB-\{Cd/(Cp+Cd)\}(VGH-VGL)-Vf3<VSS \quad (11)$$

$$VB-Q_{s}\max/(Cp+Cd)-Vf3>VSS+Vth1 \quad (12)$$

VRH and VRL are set to satisfy Expressions (13) and (14). The definitions of symbols in Expressions are same as those of the first exemplary embodiment.

$$VRL<VB-\{Cd/(Cp+Cd)\}(VGH-VGL)-Q_{s}\max/(Cp+Cd)-Vf3 \quad (13)$$

$$VRH>VB+Vth3 \quad (14)$$

In the integrating period T1, hole-electron pairs are excited inside the photodiode 210 according to the amount of the X-ray irradiated to each of the pixels 203. The electric charges accumulated in the photodiode 210 are decreased by the generated holes and electrons. Assuming that the decrease amount of the electric charges is Qs, the potential of the node Na can be expressed as in Expression (15). It is to be noted that the potential of the node Na drops due to the decrease in the electric charges since the cathode terminal 21k of the photodiode 210 is connected to the node Na.

$$VNa=VB-\{Cd/(Cp+Cd)\}(VGH-VGL)-Qs/(Cp+Cd)-Vf3 \quad (15)$$

In the period T2 of the readout period, the potential of the scan line Gn is increased to VGH and the potential of the cathode terminal 21k of the photodiode 210 is also increased. Thereby, the potential of the node Na is increased as well. The potential of the node Na in that state can be expressed as follows.

$$VNa=VB-Qs/(Cp+Cd)-Vf3 \quad (16)$$

Since Qs is smaller than Qsmax, it can be found from Expression (12) that the value of VNa becomes larger than VSS+Vth1. Thus, the gate-source voltage of the TFT 220 becomes equal to or larger than the threshold voltage of the TFT 220, and an electric current flows between the drain and the source of the TFT 220.

In a case where the circuit shown in FIG. 2B is used as the signal processing circuit 300 and the value of the resistance 310 is sufficiently large, the voltage of the node Nb can be expressed as follows.

$$VNb=VB-Qs/(Cp+Cd)-Vf3-Vth1 \quad (17)$$

As it can be seen from the fact that Expression (17) contains member Qs, the voltage according to the intensity of the X-ray irradiated to the image sensor 103 can be detected by the node Nb.

In the period T3 of the readout period, the potential of the control line Rn is increased to VRH. VRH satisfies Expression (14), so that the voltage between the gate and the source of the TFT 240 becomes larger than the threshold voltage Vth3 of the TFT 240. Thus, the TFT 240 comes to be in an electrically connected state. As a result, the potential of the node Na turns to VB, and the voltages of the both ends of the photodiode 210 are also reset to VGH−VB.

In the period T4 of the readout period, the potential of the control line Rn is decreased to VRL. Upon that, the TFT 240 comes to be in an electrically disconnected state. However, at that time, the electric charge by feedthrough flows to the node Na, so that the potential of the node Na is decreased by the amount of the feedthrough voltage Vf3, which can be expressed as follows.

$$VNa = VB - Vf3 \tag{18}$$

In the period T4, the potential of the scan line Gn keeps the high potential level so that the gate-source voltage of the TFT 220 is equal to or larger than the threshold voltage. Thus, the potential of the node Nb can be expressed as follows.

$$VNb = VB - Vf3 - Vth1 \tag{19}$$

From Expressions (17) and (19), a following voltage can be acquired for a differential voltage Vsig between the voltage of the node Nb in the period T2 and the voltage of the node Nb in the period T4.

$$Vsig = Qs/(Cp + Cd) \tag{20}$$

As can be seen from Expression (20), the signal voltage Vsig does not contain the threshold voltage Vth1 of the TFT 220 and the feedthrough voltage Vf3 of the TFT 240. The voltage difference of the node Nb in the period T2 and the period T4 can be acquired by using the circuit shown in FIG. 6, and the operations thereof are the same as those described in the first exemplary embodiment.

With the third exemplary embodiment, it is possible to operate the image sensor 103 of the high S/N ratio at a high speed without having a problem in terms of the reliability. Further, the manufacturing cost can be decreased. The reasons thereof will be described.

With the image sensor 103, it is possible to increase the S/N ratio. The reason is the same as the case of the first exemplary embodiment.

With the image sensor 103, there is no adverse effect imposed upon the reliability even when the amplifier circuit by the TFT 220 is provided. The reason is also the same as the case of the first exemplary embodiment.

With the image sensor 103, high-speed operations can be achieved. The reason is the same as the case of the second exemplary embodiment.

With the image sensor 103 of the third exemplary embodiment, the manufacturing cost can be decreased. The reason is the same as the case of the second exemplary embodiment.

While the inverted-staggered-structure a-Si TFT and oxide semiconductor TFT are referred as the transistors that can be employed for the image sensors of each of the exemplary embodiments, it is also possible to employ other transistors. For example, organic transistors of pentacene, for example, can be employed.

Figure 15A:
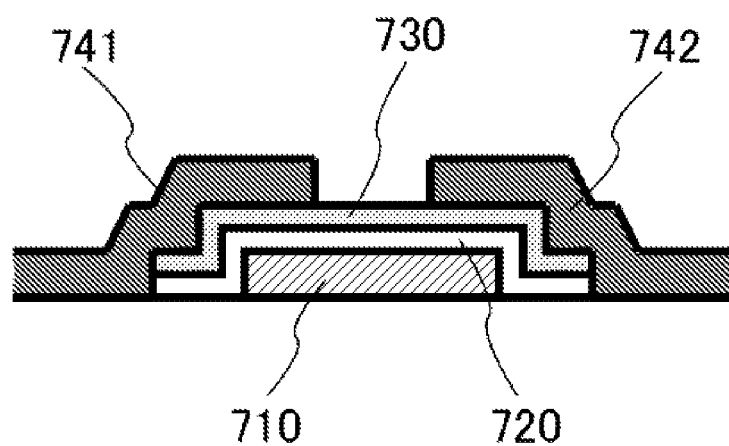
FIG. 15A is a sectional view showing the structure (1) of a TFT that can be employed to the image sensors according to each of the exemplary embodiments.
Figure 15B:
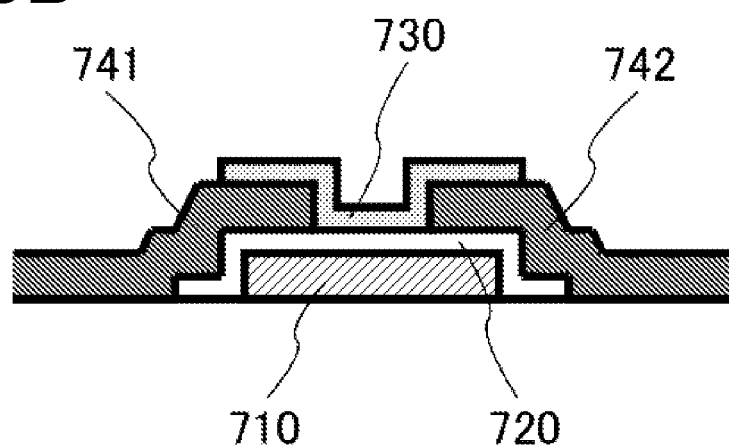
FIG. 15B is a sectional view showing the structure (2) of a TFT that can be employed to the image sensors according to each of the exemplary embodiments.
Figure 16:
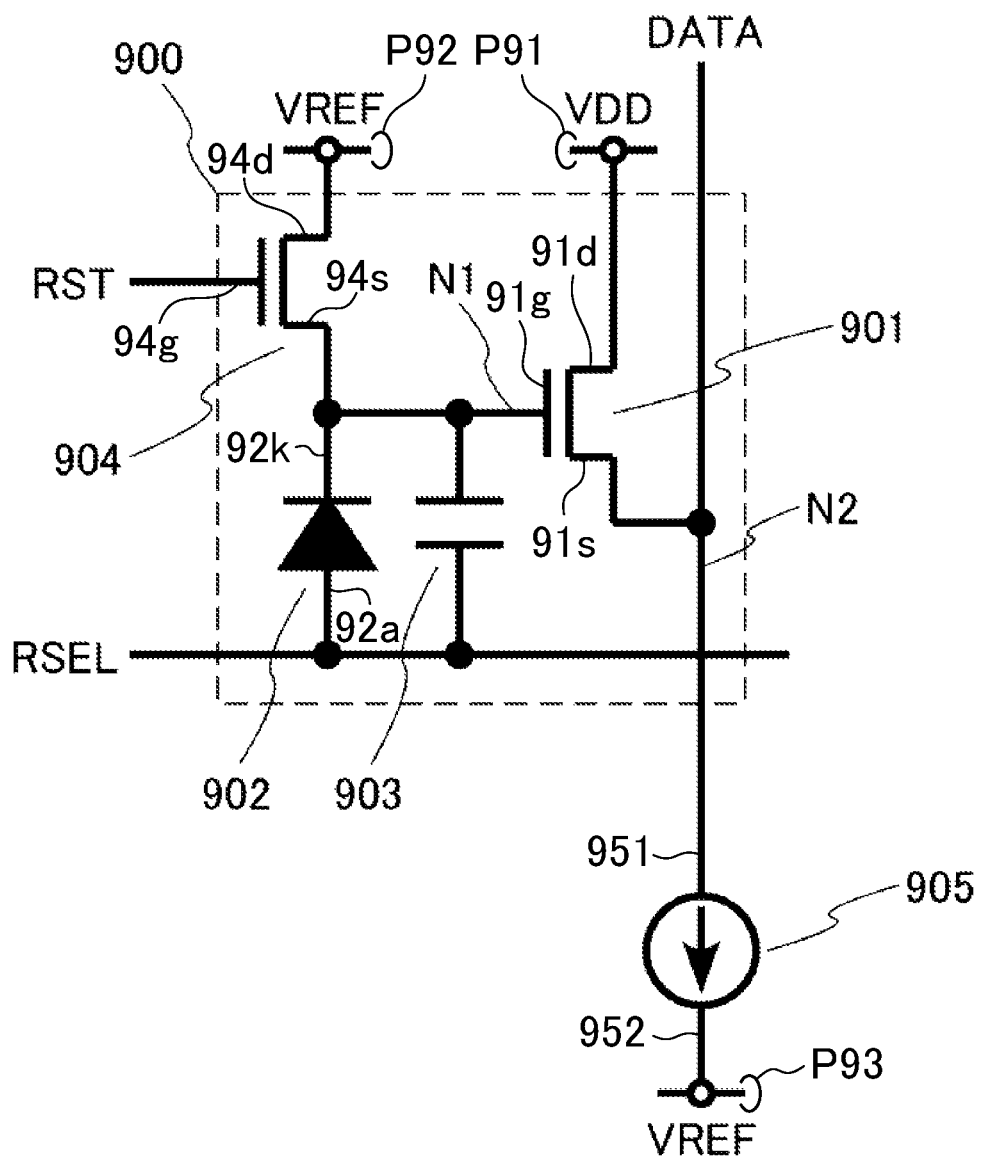
FIG. 16 is a circuit diagram showing the structure of an image sensor according to Related Art 1.
Figure 17:
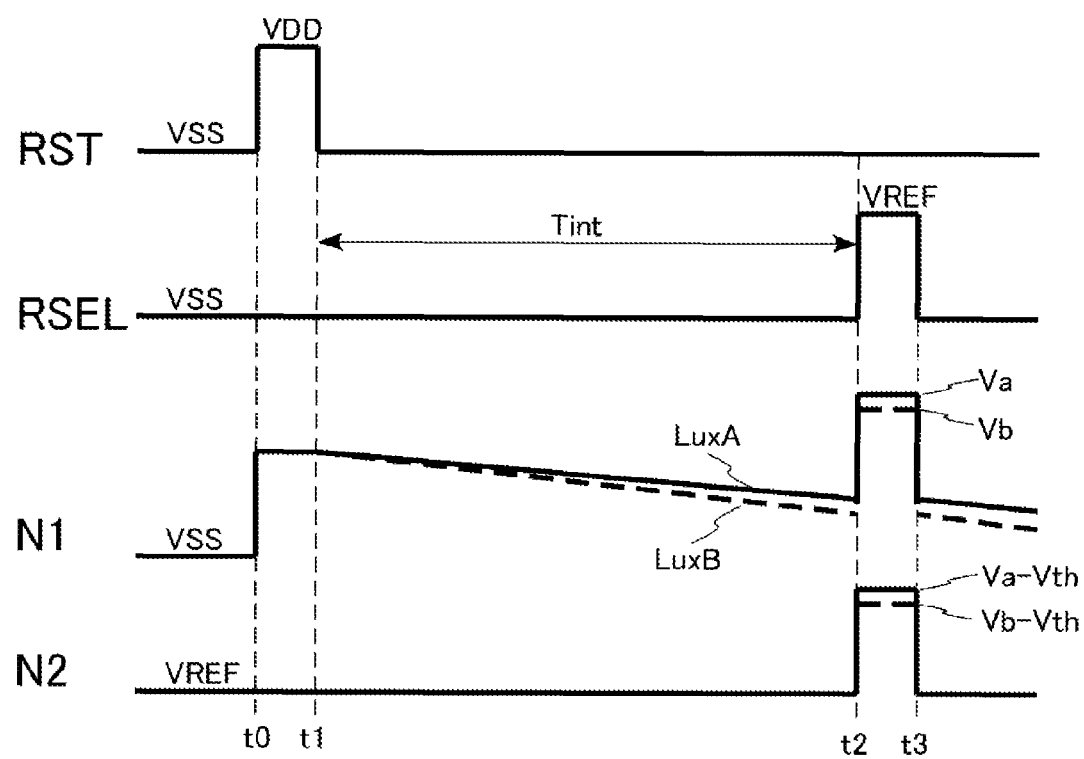
FIG. 17 is a timing chart showing operations of the image sensor according to Related Art 1.
Figure 18:
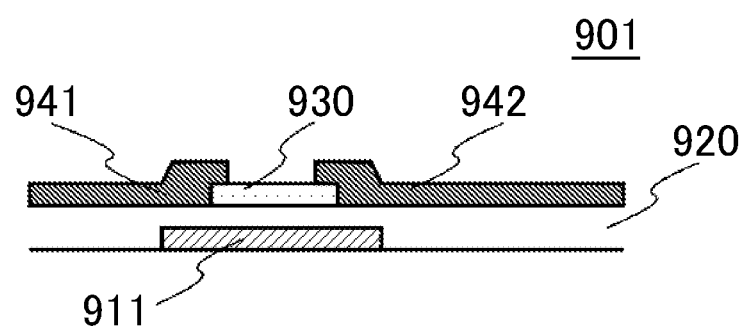
FIG. 18 is a sectional view showing a TFT of an inverted staggered structure.

The organic transistor is often formed in a top contact structure as shown in FIG. 15A or in a bottom contact structure as shown in FIG. 15B. The top contact structure organic transistor shown in FIG. 15A is fabricated by: stacking a gate insulating film 720 and an organic semiconductor film 730 on a gate electrode 710 formed on a substrate; and forming a drain electrode 741 and a source electrode 742 on both ends of the organic semiconductor film 730. The bottom contact structure organic transistor shown in FIG. 15B is fabricated by: forming a gate insulating film 720 on a gate electrode 710 formed on a substrate; a drain electrode 741 and a source electrode 742 isolated from each other are formed thereon; and further an organic semiconductor film 730 is formed on the drain electrode 741, the source electrode 742, and the gate insulating film 720 between those electrodes.

As in the case of the inverted staggered structure, the two-dimensionally overlapping area of the gate electrode 710, the source electrode 742, and the drain electrode 741 is large with those structures, and the gate-source capacitance and the gate-drain capacitance are large. Thus, the effects that have already been described can be acquired by employing the structures of the image sensors of each of the exemplary embodiments.

Further, the present invention can be generalized as follows. That is, the present invention: has the structure in which the two-dimensionally overlapping area of the gate electrode, the source electrode, and the drain electrode is large; and employs the transistor in which the fluctuation in the threshold voltage when a negative gate-source stress is applied is smaller than the fluctuation in the threshold voltage when a positive gate-source stress is applied. When the present invention is employed to the image sensor, the effects that have already been described can be acquired.

In other words, it is the subject of the present invention to overcome, in an image sensor in which the amplifier circuit is disposed at each pixel, such an issue that the threshold voltage of the transistor fluctuates so that the signal voltage fluctuates because a voltage is continuously applied between the source and the gate of the transistor at all times when using the amorphous thin film semiconductor as the transistor that constitutes an amplifier circuit. The solving means of the present invention is to: control the gate-source potential of the TFT that constitutes the amplifier circuit in such a manner that the gate terminal voltage becomes smaller than the source terminal voltage in an integrating period where the pixels accumulate the signals; and control in such a manner that the gate terminal voltage becomes larger than the source terminal voltage in a readout period where the pixels output the signals.

While the present invention has been described above by referring to the structures and operations of each of the exemplary embodiments, the present invention is not limited only to each of the exemplary embodiments described above. It is to be noted that the present invention includes various changes and modifications which can occur to those skilled in the art without departing from the scope of the present invention. Further, the present invention includes the structures acquired by mutually and properly combining a part of or a whole part of the structures of each of the above-described exemplary embodiments.

While a part of or a whole part of the above-described embodiments can be summarized as following Supplementary Notes, the present invention is not limited only to the following structures.

(Supplementary Note 1)

An image sensor which includes a photodiode, a first TFT, a second TFT, and a third TFT provided at each pixel, wherein:

an anode terminal of the photodiode is connected to a gate terminal of the first TFT and a source terminal of the third TFT, and a cathode terminal of the photodiode is connected to a first control signal line;

a drain terminal of the first TFT is connected to a first power source line, and a source terminal of the first TFT is connected to a drain terminal of the second TFT;

a gate terminal of the second TFT is connected to the first control signal line, and a source terminal of the second TFT is connected to an output signal line; and a gate terminal of the third TFT is connected to a second control signal line, and a drain terminal of the third TFT is connected to a second power source line.

(Supplementary Note 2)

An image sensor which includes a photodiode, a first TFT, and a second TFT provided at each pixel, wherein:

one of terminals of the photodiode is connected to a gate terminal of the first TFT and a source terminal of the second TFT, and other terminal is connected to a first control signal line;

a drain terminal of the first TFT is connected to a first power source line, and a source terminal of the first TFT is connected to an output signal line;

a gate terminal of the second TFT is connected to a second control signal line, and a drain terminal of the second TFT is connected to a second power source line;

the first TFT and the second TFT are formed with an inverted staggered structure, a top contact structure, or a bottom contact structure; and in the first TFT, a two-dimensionally overlapping area of a source electrode and a gate electrode is smaller than a two-dimensionally overlapping area of a drain electrode and the gate electrode.

(Supplementary Note 3)

The image sensor as depicted in Supplementary Note 2, wherein:

the first TFT includes a curve part in a first border line between a drain region and a channel region and in a second border line between a source region and the channel region; and length of the first border line is longer than length of the second border line.

(Supplementary Note 4)

The image sensor as depicted in Supplementary Note 1, wherein the first to third TFTs are formed with an amorphous silicon or an oxide semiconductor.

(Supplementary Note 5)

The image sensor as depicted in Supplementary Note 2 or 3, wherein the first and second TFTs are formed with an amorphous silicon or an oxide semiconductor.

(Supplementary Note 6)

A method for driving an image sensor which includes a photodiode, a first TFT, a second TFT, and a third TFT provided at each pixel, wherein:

an anode terminal of the photodiode is connected to a gate terminal of the first TFT and a source terminal of the third TFT, and a cathode terminal of the photodiode is connected to a first control signal line;

a drain terminal of the first TFT is connected to a first power source line, and a source terminal of the first TFT is connected to a drain terminal of the second TFT;

a gate terminal of the second TFT is connected to the first control signal line, and a source terminal of the second TFT is connected to an output signal line; and a gate terminal of the third TFT is connected to a second control signal line, and a drain terminal of the third TFT is connected to a second power source line, and the method includes:

dividing a driving period of the image sensor to an integrating period where a light signal is irradiated to the pixels and to a readout period where a signal is read out from the pixels;

setting a gate voltage of the first TFT to be smaller than a source voltage of the first TFT in the integrating period; and setting the gate voltage of the first TFT to be larger than the source voltage of the first TFT in the readout period.

(Supplementary Note 7)

A method for driving an image sensor which includes a photodiode, a first TFT, and a second TFT provided at each pixel, wherein:

one of terminals of the photodiode is connected to a gate terminal of the first TFT and a source terminal of the second TFT, and other terminal is connected to a first control signal line;

a drain terminal of the first TFT is connected to a first power source line, and a source terminal of the first TFT is connected to an output signal line;

a gate terminal of the second TFT is connected to a second control signal line, and a drain terminal of the second TFT is connected to a second power source line;

the first TFT and the second TFT are formed with an inverted staggered structure, a top contact structure, or a bottom contact structure; and in the first TFT, a two-dimensionally overlapping area of a source electrode and a gate electrode is smaller than a two-dimensionally overlapping area of a drain electrode and the gate electrode, and the method includes:

dividing a driving period of the image sensor to an integrating period where a light signal is irradiated to the pixels and to a readout period where a signal is read out from the pixels;

setting a gate voltage of the first TFT to be smaller than a source voltage of the first TFT in the integrating period; and setting the gate voltage of the first TFT to be larger than the source voltage of the first TFT in the readout period.

(Supplementary Note 8)

An image sensor which includes:

a photoelectric conversion element in which a voltage between two terminals changes according to a light receiving amount;

a reset switch element whose on-and-off is controlled, which resets the voltage between the two terminals to an initial value by applying a constant voltage to the photoelectric conversion element by being set on;

an amplify element which amplifies and outputs the voltage between the two terminals;

a driving circuit which controls on-and-off of the reset switch element and sets on the reset switch element in every constant time; and a signal processing circuit which inputs signals outputted from the amplifier element when the reset switch element is off before and after the reset switch element is set on as a first signal and a second signal, respectively, and acquires a difference between the first signal and the second signal.

(Supplementary Note 9)

The image sensor as depicted in Supplementary Note 8, which further includes an output control switch element whose on-and-off is controlled, which electrically connects the amplifier element and the signal processing circuit by being set on, wherein the driving circuit controls on-and-off of the output control switch element, and sets on the output control switch element when the amplifier element outputs the first signal and the second signal.

(Supplementary Note 10)

The image sensor as depicted in Supplementary Note 8, wherein:

the amplifier element is formed with an inverted staggered structure TFT, a top contact structure TFT, or a bottom contact structure TFT; and a two-dimensionally overlapping area of the source electrode and the gate electrode is smaller than a two-dimensionally overlapping area of the drain electrode and the gate electrode.

(Supplementary Note 11)

The image sensor as depicted in Supplementary Note 8 or 9, wherein:

the amplifier element is formed with a TFT; a voltage is applied in such a manner that a gate voltage becomes higher than a source voltage at the time when outputting the first signal and the second signal; and a voltage is applied in such a manner that the gate voltage becomes lower than the source voltage in other time.

INDUSTRIAL APPLICABILITY

The image sensor and the driving method thereof according to the present invention can be utilized for the technique which executes nondestructive texting of the inside of examination targets by using X-ray transmission images, for example. Specifically, the present invention can be utilized in the fields of medical treatment, industrial nondestructive testing, and the like.

What is claimed is:

1. An image sensor, comprising:
a photodiode, a first thin film transistor (TFT), and a second TFT provided at each pixel, wherein:
one of terminals of the photodiode is connected to a gate terminal of the first TFT and a source terminal of the second TFT, and other terminal is connected to a first control signal line,
a drain terminal of the first TFT is connected to a first power source line, and a source terminal of the first TFT is connected to an output signal line,
a gate terminal of the second TFT is connected to a second control signal line, and a drain terminal of the second TFT is connected to a second power source line,
the first TFT and the second TFT are formed with an inverted staggered structure, a top contact structure, or a bottom contact structure,
in the first TFT, a two-dimensionally overlapping area of a source electrode and a gate electrode is smaller than a two-dimensionally overlapping area of a drain electrode and the gate electrode,
the first TFT includes a curve part in a first border line between a drain region connected to the first power source line via the drain terminal and a channel region and in a second border line between a source region connected to the output signal line via the source terminal and the channel region, and
a length of the first border line is longer than a length of the second border line.

2. The image sensor as claimed in claim 1, wherein the first and second TFTs are formed with an amorphous silicon or an oxide semiconductor.

3. The image sensor as claimed in claim 1, wherein:
a driving period of the image sensor is divided into an integrating period where a light signal is irradiated to the pixels and a readout period where a signal is read out from the pixels,
a gate voltage of the first TFT is set to be smaller than a source voltage of the first TFT in the integrating period, and
the gate voltage of the first TFT is set to be larger than the source voltage of the first TFT in the readout period.

* * * * *